(12) United States Patent
Veenstra et al.

(10) Patent No.: US 8,764,240 B2
(45) Date of Patent: Jul. 1, 2014

(54) ELECTRICAL DEVICE HAVING BOARDLESS ELECTRICAL COMPONENT MOUNTING ARRANGEMENT

(75) Inventors: Thomas J. Veenstra, Zeeland, MI (US); Paul T. Vander Kuyl, Holland, MI (US); Matthew S. Weeda, Hudsonville, MI (US); Michael L. Lanser, Holland, MI (US); Kyle A. Israels, Zeeland, MI (US); Jason R. Mulder, Zeeland, MI (US); Mark W. Vander Pol, Edgerton, MN (US)

(73) Assignee: Innotec Corp., Zeeland, MI (US)

( * ) Notice: Subject to any disclaimer, the term of this patent is extended or adjusted under 35 U.S.C. 154(b) by 276 days.

(21) Appl. No.: 13/039,130

(22) Filed: Mar. 2, 2011

(65) Prior Publication Data

US 2011/0146068 A1  Jun. 23, 2011

Related U.S. Application Data

(62) Division of application No. 11/842,606, filed on Aug. 21, 2007, now Pat. No. 7,909,482.

(60) Provisional application No. 60/838,982, filed on Aug. 21, 2006.

(51) Int. Cl.
*F21V 15/00* (2006.01)

(52) U.S. Cl.
USPC . 362/267; 362/310; 362/311.02; 362/311.15; 257/100; 257/687; 264/272.11; 264/272.16; 438/126; 438/127

(58) Field of Classification Search
USPC ........ 362/267, 310, 311.01, 311.02; 257/678, 257/687, 790, 787; 264/219, 239, 241, 259, 264/271.1, 272.11, 272.15, 272.16; 445/1, 445/22; 174/521; 438/112, 124, 127, 123; 29/592.1, 825, 831, 832, 841
See application file for complete search history.

(56) References Cited

U.S. PATENT DOCUMENTS

| | | | |
|---|---|---|---|
| 1,515,717 A | 11/1924 | Ayotte | |
| 2,254,962 A | 9/1941 | Harris et al. | |
| 3,456,043 A | 7/1969 | Emery | |
| 3,541,488 A | 11/1970 | Odson | |

(Continued)

FOREIGN PATENT DOCUMENTS

| | | |
|---|---|---|
| DE | 3916875 A1 | 12/1990 |
| DE | 29811417 | 10/1998 |

(Continued)

OTHER PUBLICATIONS

Korean Intellectual Property Office, "International Search Report," International Application No. US2008/086521 Jul. 23, 2009 (3 pages).

(Continued)

*Primary Examiner* — Thomas Sember
(74) *Attorney, Agent, or Firm* — Price Heneveld LLP

(57) ABSTRACT

An electrical device such as an LED light assembly includes a conductive circuit and one or more electrical components connected to the circuit. The electrical components and the circuit are at least partially overmolded with a thermoplastic polymer material to encapsulate the components. The material utilized to cover the circuit and/or electrical components may also be utilized to form a housing or other structure of a finished part.

46 Claims, 20 Drawing Sheets

(56) References Cited

U.S. PATENT DOCUMENTS

| | | | |
|---|---|---|---|
| 4,041,301 A | 8/1977 | Pelchat |
| 4,173,035 A | 10/1979 | Hoyt |
| 4,211,955 A | 7/1980 | Ray |
| 4,267,559 A | 5/1981 | Johnson et al. |
| 4,277,819 A | 7/1981 | Sobota et al. |
| 4,453,903 A | 6/1984 | Pukaite |
| 4,544,991 A | 10/1985 | Gorsuch |
| 4,645,970 A | 2/1987 | Murphy |
| 4,733,335 A | 3/1988 | Serizawa et al. |
| 4,744,011 A | 5/1988 | Tomita et al. |
| 4,764,645 A | 8/1988 | Takasawa |
| 4,788,630 A | 11/1988 | Gavagan |
| 4,794,431 A | 12/1988 | Park |
| 4,819,136 A | 4/1989 | Ramsey |
| 4,857,483 A | 8/1989 | Steffen et al. |
| 4,860,436 A | 8/1989 | Hirabayashi et al. |
| 4,885,663 A | 12/1989 | Parker |
| 4,886,960 A | 12/1989 | Molyneux et al. |
| 4,897,771 A | 1/1990 | Parker |
| 4,907,132 A | 3/1990 | Parker |
| 4,935,665 A | 6/1990 | Murata |
| 4,948,242 A | 8/1990 | Desmond et al. |
| 4,954,308 A | 9/1990 | Yabe et al. |
| 4,965,933 A | 10/1990 | Mraz et al. |
| 4,965,950 A | 10/1990 | Yamada |
| 4,985,810 A | 1/1991 | Ramsey |
| 5,036,248 A | 7/1991 | McEwan et al. |
| 5,038,255 A | 8/1991 | Nishihashi et al. |
| 5,070,219 A | 12/1991 | Grosskrueger et al. |
| 5,119,174 A | 6/1992 | Chen |
| 5,136,483 A | 8/1992 | Schoniger et al. |
| 5,160,200 A | 11/1992 | Cheselske |
| 5,160,201 A | 11/1992 | Wrobel |
| 5,161,872 A | 11/1992 | Sasaki et al. |
| 5,178,448 A | 1/1993 | Adams et al. |
| 5,182,032 A | 1/1993 | Dickie et al. |
| 5,193,895 A | 3/1993 | Naruke et al. |
| 5,203,060 A | 4/1993 | Mraz et al. |
| 5,228,223 A | 7/1993 | Lan |
| 5,236,374 A | 8/1993 | Leonard et al. |
| 5,239,406 A | 8/1993 | Lynam |
| 5,241,457 A | 8/1993 | Sasajima |
| 5,249,104 A | 9/1993 | Mizobe |
| 5,285,060 A | 2/1994 | Larson et al. |
| 5,297,010 A | 3/1994 | Camarota et al. |
| 5,313,729 A | 5/1994 | Sakai et al. |
| 5,325,271 A | 6/1994 | Hutchisson |
| 5,325,275 A | 6/1994 | Liu |
| 5,334,539 A | 8/1994 | Shinar et al. |
| 5,337,225 A | 8/1994 | Brookman |
| 5,355,245 A | 10/1994 | Lynam |
| 5,371,659 A | 12/1994 | Pastrick et al. |
| 5,382,811 A | 1/1995 | Takahashi |
| 5,404,282 A | 4/1995 | Klinke et al. |
| 5,430,627 A | 7/1995 | Nagano |
| 5,463,280 A | 10/1995 | Johnson |
| 5,467,627 A | 11/1995 | Smith et al. |
| 5,497,305 A | 3/1996 | Pastrick et al. |
| 5,497,306 A | 3/1996 | Pastrick |
| 5,499,170 A | 3/1996 | Gagne |
| 5,527,743 A * | 6/1996 | Variot ............................ 29/827 |
| 5,530,240 A | 6/1996 | Larson et al. |
| 5,563,422 A | 10/1996 | Nakamura et al. |
| 5,567,036 A | 10/1996 | Theobald et al. |
| 5,568,964 A | 10/1996 | Parker et al. |
| 5,570,272 A * | 10/1996 | Variot ............................ 361/723 |
| 5,572,812 A | 11/1996 | Mastuoka |
| 5,578,839 A | 11/1996 | Nakamura et al. |
| 5,613,751 A | 3/1997 | Parker et al. |
| 5,617,297 A | 4/1997 | Lo et al. |
| 5,618,096 A | 4/1997 | Parker et al. |
| 5,632,551 A | 5/1997 | Roney et al. |
| 5,641,221 A | 6/1997 | Schindele et al. |
| 5,649,756 A | 7/1997 | Adams et al. |
| 5,652,434 A | 7/1997 | Nakamura et al. |
| 5,669,698 A | 9/1997 | Valdman et al. |
| 5,669,699 A | 9/1997 | Pastrick et al. |
| 5,669,704 A | 9/1997 | Pastrick |
| 5,671,996 A | 9/1997 | Bos et al. |
| 5,673,994 A | 10/1997 | Fant, Jr. et al. |
| 5,680,245 A | 10/1997 | Lynam |
| 5,708,428 A | 1/1998 | Phillips |
| 5,722,281 A | 3/1998 | Yasuda et al. |
| 5,734,182 A | 3/1998 | Nakamura et al. |
| 5,746,497 A | 5/1998 | Machida |
| 5,747,832 A | 5/1998 | Nakamura et al. |
| 5,752,766 A | 5/1998 | Bailey et al. |
| 5,765,940 A | 6/1998 | Levy et al. |
| 5,786,665 A | 7/1998 | Ohtsuki et al. |
| 5,803,579 A | 9/1998 | Turnbull et al. |
| 5,806,965 A | 9/1998 | Deese |
| 5,848,837 A | 12/1998 | Gustafson |
| 5,868,116 A | 2/1999 | Betts et al. |
| 5,876,107 A | 3/1999 | Parker et al. |
| 5,877,558 A | 3/1999 | Nakamura et al. |
| 5,880,486 A | 3/1999 | Nakamura et al. |
| 5,894,686 A | 4/1999 | Parker et al. |
| 5,895,115 A | 4/1999 | Parker et al. |
| 5,909,037 A | 6/1999 | Rajkomar et al. |
| 5,915,830 A | 6/1999 | Dickson et al. |
| 5,921,652 A | 7/1999 | Parker et al. |
| 5,921,660 A | 7/1999 | Yu |
| 5,927,845 A | 7/1999 | Gustafson et al. |
| 5,934,798 A | 8/1999 | Roller et al. |
| 5,938,321 A | 8/1999 | Bos et al. |
| 5,944,414 A | 8/1999 | Nishitani et al. |
| 5,945,688 A | 8/1999 | Kasahara et al. |
| 5,947,588 A | 9/1999 | Huang |
| 5,951,349 A * | 9/1999 | Larose et al. .................... 445/22 |
| 5,998,925 A | 12/1999 | Shimizu et al. |
| 6,000,287 A | 12/1999 | Menzel |
| 6,005,210 A | 12/1999 | Chien |
| 6,030,089 A | 2/2000 | Parker et al. |
| 6,045,240 A | 4/2000 | Hochstein |
| 6,049,463 A | 4/2000 | O'Malley et al. |
| 6,070,998 A | 6/2000 | Jennings et al. |
| 6,079,838 A | 6/2000 | Parker et al. |
| 6,082,870 A | 7/2000 | George |
| 6,097,501 A | 8/2000 | Hayashi et al. |
| 6,113,247 A | 9/2000 | Adams et al. |
| 6,113,248 A | 9/2000 | Mistopoulos et al. |
| 6,124,886 A | 9/2000 | DeLine et al. |
| 6,139,172 A | 10/2000 | Bos et al. |
| 6,152,575 A | 11/2000 | Montanino |
| 6,152,590 A | 11/2000 | Furst et al. |
| 6,158,867 A | 12/2000 | Parker et al. |
| 6,158,882 A | 12/2000 | Bischoff, Jr. |
| 6,162,381 A | 12/2000 | Onishi et al. |
| 6,164,805 A | 12/2000 | Hulse |
| 6,170,313 B1 | 1/2001 | Vasseur et al. |
| 6,190,026 B1 | 2/2001 | Moore |
| 6,204,512 B1 | 3/2001 | Nakamura et al. |
| 6,215,133 B1 | 4/2001 | Nakamura et al. |
| 6,220,722 B1 | 4/2001 | Begemann |
| 6,234,648 B1 | 5/2001 | Borner et al. |
| 6,244,734 B1 | 6/2001 | Hulse |
| 6,255,613 B1 | 7/2001 | Yang |
| 6,276,822 B1 | 8/2001 | Bedrosian et al. |
| 6,283,612 B1 | 9/2001 | Hunter |
| 6,347,880 B1 | 2/2002 | Furst et al. |
| 6,347,881 B1 | 2/2002 | Serizawa et al. |
| 6,357,902 B1 | 3/2002 | Horowitz |
| 6,371,636 B1 | 4/2002 | Wesson |
| 6,402,570 B2 | 6/2002 | Soga et al. |
| 6,404,131 B1 | 6/2002 | Kanano et al. |
| 6,412,973 B1 | 7/2002 | Bos et al. |
| 6,419,306 B2 | 7/2002 | Sano et al. |
| 6,461,017 B2 | 10/2002 | Selkee |
| 6,469,323 B1 | 10/2002 | Nakamura et al. |
| 6,483,623 B1 | 11/2002 | Maruyama |
| 6,531,324 B2 | 3/2003 | Hsu et al. |
| 6,531,328 B1 | 3/2003 | Chen |
| 6,536,923 B1 | 3/2003 | Merz |
| 6,580,228 B1 | 6/2003 | Chen et al. |

(56) References Cited

U.S. PATENT DOCUMENTS

| | | |
|---|---|---|
| 6,583,550 B2 | 6/2003 | Iwasa et al. |
| 6,595,671 B2 | 7/2003 | Lefebyre et al. |
| 6,598,996 B1 | 7/2003 | Lodhie |
| 6,604,834 B2 | 8/2003 | Kalana |
| 6,616,313 B2 | 9/2003 | Fuerst |
| 6,617,786 B1 | 9/2003 | Centofante |
| 6,653,572 B2 | 11/2003 | Ishiwa et al. |
| 6,659,632 B2 | 12/2003 | Chen |
| 6,669,267 B1 | 12/2003 | Lynam et al. |
| 6,673,292 B1 * | 1/2004 | Gustafson et al. ............ 264/149 |
| 6,682,331 B1 | 1/2004 | Peh et al. |
| 6,683,250 B2 | 1/2004 | Luettgen et al. |
| 6,709,132 B2 | 3/2004 | Ishibashi |
| 6,709,137 B1 | 3/2004 | Glovak et al. |
| 6,724,543 B1 | 4/2004 | Chinniah et al. |
| 6,726,502 B1 | 4/2004 | Hayes |
| 6,729,055 B2 | 5/2004 | Chou |
| 6,739,733 B1 | 5/2004 | Lamke et al. |
| 6,739,744 B2 | 5/2004 | Williams et al. |
| 6,755,547 B2 | 6/2004 | Parker |
| 6,757,969 B1 | 7/2004 | Chan |
| 6,786,625 B2 | 9/2004 | Wesson |
| 6,793,371 B2 | 9/2004 | Lamke et al. |
| 6,793,374 B2 | 9/2004 | Begemann |
| 6,812,481 B2 | 11/2004 | Matsumura et al. |
| 6,814,474 B2 | 11/2004 | Groeller |
| 6,828,170 B2 | 12/2004 | Roberts et al. |
| 6,848,818 B2 | 2/2005 | Huizenga |
| 6,860,628 B2 | 3/2005 | Robertson et al. |
| 6,866,394 B1 | 3/2005 | Hutchins et al. |
| 6,874,925 B2 | 4/2005 | Page et al. |
| 6,889,456 B2 | 5/2005 | Shibata et al. |
| 6,899,449 B2 | 5/2005 | Hatagishi et al. |
| 6,907,643 B2 | 6/2005 | Koops et al. |
| 6,910,783 B2 | 6/2005 | Mezei et al. |
| 6,919,629 B2 * | 7/2005 | Mercado ...................... 257/687 |
| 6,921,926 B2 | 7/2005 | Hsu |
| 6,930,332 B2 | 8/2005 | Hashimoto et al. |
| 6,942,360 B2 | 9/2005 | Chou et al. |
| 6,949,709 B1 | 9/2005 | Barat et al. |
| 6,971,758 B2 | 12/2005 | Inui et al. |
| 6,979,100 B2 | 12/2005 | Reiff et al. |
| 6,982,518 B2 | 1/2006 | Chou et al. |
| 6,988,819 B2 | 1/2006 | Siktberg et al. |
| 6,997,576 B1 | 2/2006 | Lodhie et al. |
| 7,040,779 B2 | 5/2006 | Lamke et al. |
| 7,048,423 B2 | 5/2006 | Stepanenko et al. |
| 7,055,997 B2 | 6/2006 | Baek |
| 7,060,542 B2 | 6/2006 | Nakajima et al. |
| 7,070,304 B2 | 7/2006 | Imai |
| 7,071,523 B2 | 7/2006 | Yano et al. |
| 7,080,446 B2 | 7/2006 | Baba et al. |
| 7,081,644 B2 | 7/2006 | Flaherty et al. |
| 7,083,311 B2 | 8/2006 | Schreck et al. |
| 7,086,756 B2 | 8/2006 | Maxik |
| 7,102,213 B2 | 9/2006 | Sorg |
| 7,114,830 B2 | 10/2006 | Robertson et al. |
| 7,118,646 B2 | 10/2006 | Hunkeler |
| 7,119,422 B2 | 10/2006 | Chin |
| 7,128,442 B2 | 10/2006 | Lee et al. |
| 7,140,751 B2 | 11/2006 | Lin |
| 7,160,015 B2 | 1/2007 | Parker |
| 7,172,314 B2 | 2/2007 | Currie et al. |
| 7,175,324 B2 | 2/2007 | Kwon |
| 7,195,381 B2 | 3/2007 | Lynam et al. |
| 7,199,438 B2 | 4/2007 | Appelt et al. |
| 7,213,952 B2 | 5/2007 | Iwai |
| 7,220,029 B2 | 5/2007 | Bynum et al. |
| 7,224,001 B2 | 5/2007 | Cao |
| 7,226,189 B2 | 6/2007 | Lee et al. |
| 7,241,031 B2 | 7/2007 | Sloan et al. |
| 7,249,869 B2 | 7/2007 | Takahashi et al. |
| 7,262,489 B2 | 8/2007 | Shoji |
| 7,265,322 B2 | 9/2007 | Aengenheyster et al. |
| 7,267,407 B1 | 9/2007 | Demick et al. |
| 7,268,368 B1 | 9/2007 | Knapp |
| 7,270,454 B2 | 9/2007 | Amano |
| 7,280,288 B2 | 10/2007 | Loh et al. |
| 7,282,785 B2 | 10/2007 | Yoshida |
| 7,301,176 B2 | 11/2007 | Abe et al. |
| 7,333,257 B2 | 2/2008 | Reynolds et al. |
| 7,357,525 B2 | 4/2008 | Doyle |
| 7,374,305 B2 | 5/2008 | Parker |
| 7,380,961 B2 | 6/2008 | Moriyama et al. |
| 7,384,177 B2 | 6/2008 | Parker |
| 7,384,817 B2 | 6/2008 | Takiar et al. |
| 7,387,420 B2 | 6/2008 | Ogino et al. |
| 7,402,270 B2 | 7/2008 | Mercado |
| 7,434,974 B2 | 10/2008 | Parker |
| 7,448,778 B2 | 11/2008 | Lin |
| 7,467,887 B2 | 12/2008 | Parker |
| 7,712,933 B2 | 5/2010 | Fleischmann |
| 7,815,339 B2 | 10/2010 | Veenstra et al. |
| 7,837,359 B2 | 11/2010 | Danek et al. |
| 8,004,860 B2 | 8/2011 | Salzman |
| 2002/0003700 A1 | 1/2002 | Selkee |
| 2002/0004251 A1 | 1/2002 | Roberts et al. |
| 2002/0060489 A1 | 5/2002 | Richard |
| 2002/0089849 A1 | 7/2002 | Lamke et al. |
| 2002/0105812 A1 | 8/2002 | Zimmerman et al. |
| 2002/0131261 A1 | 9/2002 | Inui et al. |
| 2003/0160256 A1 | 8/2003 | Durocher et al. |
| 2004/0056265 A1 | 3/2004 | Arndt et al. |
| 2004/0114367 A1 | 6/2004 | Li |
| 2004/0180459 A1 | 9/2004 | Hsu |
| 2004/0223328 A1 | 11/2004 | Lee et al. |
| 2004/0252501 A1 | 12/2004 | Moriyama et al. |
| 2004/0265512 A1 | 12/2004 | Aengenheyster et al. |
| 2005/0007759 A1 | 1/2005 | Parker |
| 2005/0012880 A1 | 1/2005 | Yoshii et al. |
| 2005/0032259 A1 | 2/2005 | Nakajima et al. |
| 2005/0117352 A1 | 6/2005 | Lin |
| 2005/0121829 A1 * | 6/2005 | Spurr et al. ............ 264/272.11 |
| 2005/0200045 A1 | 9/2005 | Hunkeler |
| 2005/0206040 A1 | 9/2005 | Mercado |
| 2005/0207176 A1 | 9/2005 | Johnson et al. |
| 2005/0210672 A1 | 9/2005 | Reynolds et al. |
| 2005/0213351 A1 | 9/2005 | Yang |
| 2005/0214968 A1 | 9/2005 | Waitl et al. |
| 2005/0269587 A1 | 12/2005 | Loh et al. |
| 2005/0286840 A1 | 12/2005 | Ho et al. |
| 2006/0040094 A1 | 2/2006 | Mizuno et al. |
| 2006/0043607 A1 | 3/2006 | Matsuura et al. |
| 2006/0120085 A1 | 6/2006 | Hsieh et al. |
| 2006/0157725 A1 | 7/2006 | Flaherty |
| 2006/0187652 A1 | 8/2006 | Doyle |
| 2006/0198155 A1 | 9/2006 | Nickola et al. |
| 2006/0215422 A1 | 9/2006 | Laizure, Jr. et al. |
| 2006/0220049 A1 | 10/2006 | Flaherty et al. |
| 2006/0239037 A1 | 10/2006 | Repetto et al. |
| 2006/0245188 A1 | 11/2006 | Takenada |
| 2006/0245191 A1 | 11/2006 | Ratcliffe |
| 2006/0274554 A1 | 12/2006 | Parker |
| 2007/0029569 A1 | 2/2007 | Andrews |
| 2007/0075451 A1 | 4/2007 | Winter et al. |
| 2007/0080357 A1 | 4/2007 | Ishii |
| 2007/0097683 A1 | 5/2007 | Chikugawa |
| 2007/0103901 A1 | 5/2007 | Reid |
| 2007/0103902 A1 | 5/2007 | Hsiao |
| 2007/0117248 A1 | 5/2007 | Kunze et al. |
| 2007/0121326 A1 * | 5/2007 | Nall et al. ...................... 362/294 |
| 2007/0133214 A1 | 6/2007 | Maeda et al. |
| 2007/0153503 A1 | 7/2007 | Feng |
| 2007/0153549 A1 | 7/2007 | Parker |
| 2007/0166866 A1 | 7/2007 | Appelt et al. |
| 2007/0170454 A1 | 7/2007 | Andrews |
| 2007/0187710 A1 | 8/2007 | Steen et al. |
| 2007/0194333 A1 | 8/2007 | Son |
| 2007/0194336 A1 | 8/2007 | Shin et al. |
| 2007/0194337 A1 | 8/2007 | Kondo |
| 2007/0196762 A1 | 8/2007 | Maeda et al. |
| 2007/0200127 A1 | 8/2007 | Andrews et al. |
| 2007/0200413 A1 | 8/2007 | Demick et al. |
| 2007/0205425 A1 | 9/2007 | Harada |

(56) References Cited

U.S. PATENT DOCUMENTS

| | | |
|---|---|---|
| 2007/0217192 A1 | 9/2007 | Hiratsuka |
| 2007/0241357 A1 | 10/2007 | Yan |
| 2007/0241362 A1 | 10/2007 | Han et al. |
| 2007/0257398 A1 | 11/2007 | Moncrieff |
| 2007/0259576 A1 | 11/2007 | Brandt et al. |
| 2007/0274648 A1 | 11/2007 | Ip |
| 2008/0062711 A1 | 3/2008 | Veenstra et al. |
| 2008/0066355 A1 | 3/2008 | Misawa et al. |
| 2008/0076859 A1 | 3/2008 | Eipper et al. |
| 2008/0102726 A2 | 5/2008 | Jeganathan et al. |
| 2008/0106187 A1 | 5/2008 | Suzuki et al. |
| 2008/0170405 A1 | 7/2008 | Kamiya et al. |
| 2008/0259642 A1 | 10/2008 | Parker |
| 2009/0297090 A1 | 12/2009 | Bogner et al. |

FOREIGN PATENT DOCUMENTS

| | | |
|---|---|---|
| DE | 19805771 | 8/1999 |
| DE | 102005048497 | 4/2007 |
| EP | 1657758 | 5/2006 |
| GB | 2431764 | 5/2007 |
| JP | 63292690 | 11/1988 |
| JP | 2058892 | 2/1990 |
| JP | 9129077 | 5/1997 |
| JP | 11220239 | 8/1999 |
| JP | 2002096680 | 4/2002 |
| JP | 2002287671 | 10/2002 |
| JP | 2003243712 | 8/2003 |
| JP | 2005134789 | 5/2005 |
| JP | 2005221661 | 8/2005 |
| JP | 2006062431 | 3/2006 |
| JP | 2007203873 | 8/2007 |
| JP | 2008070697 | 3/2008 |
| KR | 2000/0009857 | 2/2000 |
| TW | 200702591 | 1/2007 |
| WO | 97/48134 | 12/1997 |
| WO | 97/50132 | 12/1997 |
| WO | 00/55685 | 9/2000 |
| WO | 00/55914 | 9/2000 |
| WO | 2006059828 | 6/2006 |
| WO | 2007036207 | 4/2007 |
| WO | 2007064701 A1 | 6/2007 |
| WO | 2008024761 | 2/2008 |
| WO | 2009076579 | 6/2009 |

OTHER PUBLICATIONS

Howstuffworks, "Inside a Light Emitting Diode," 2002 (1 page).
International Search Report, International Application No. PCT/2008/076859, filed Sep. 18, 2008 (4 pages).

* cited by examiner

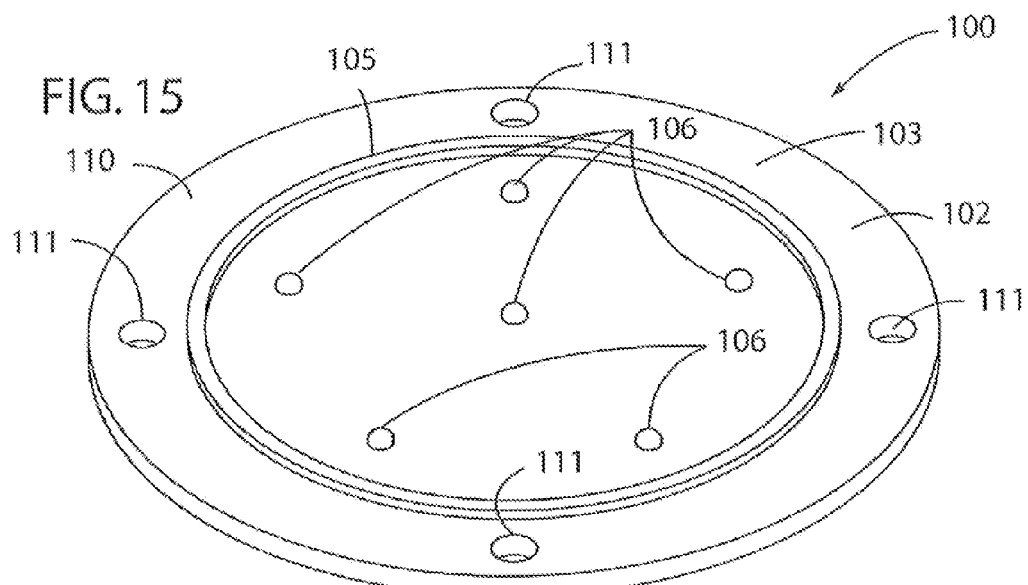
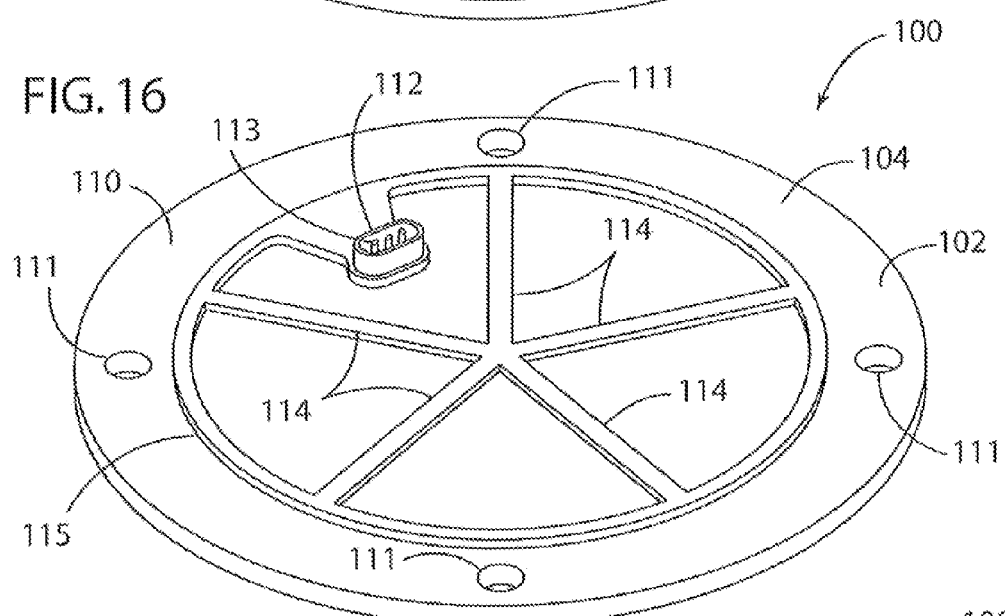
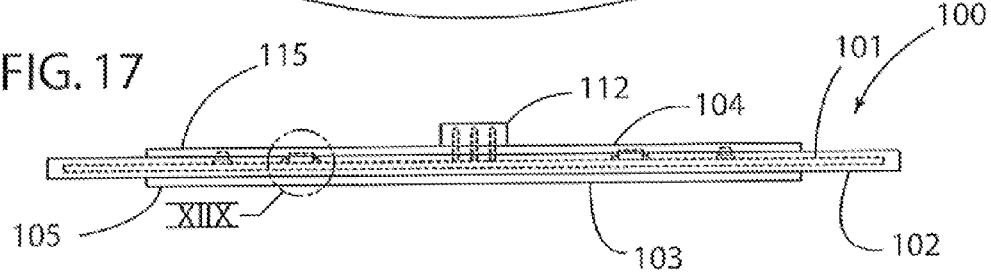

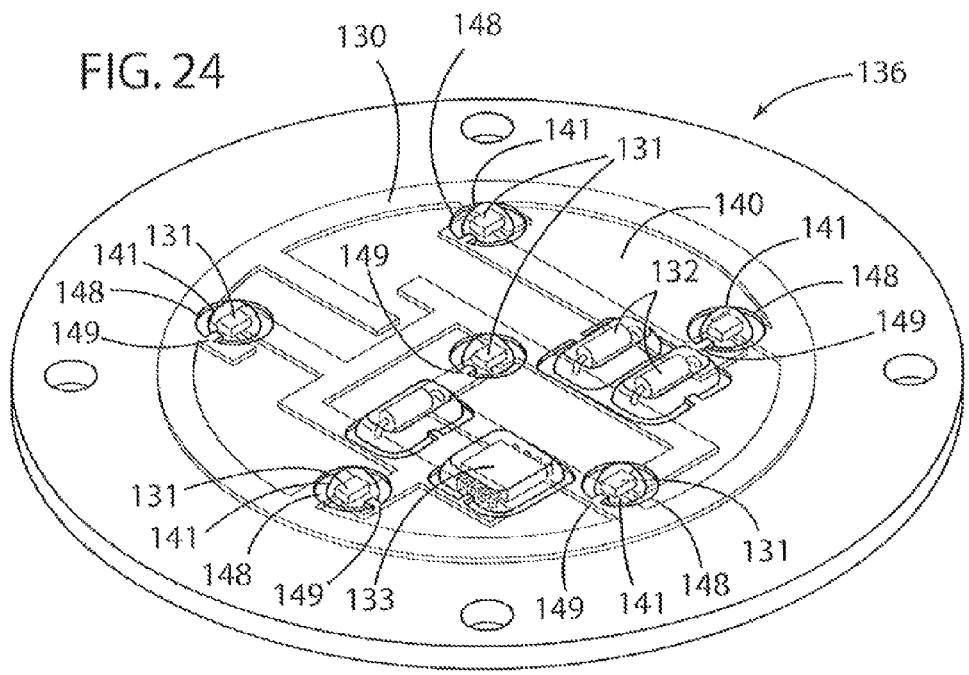
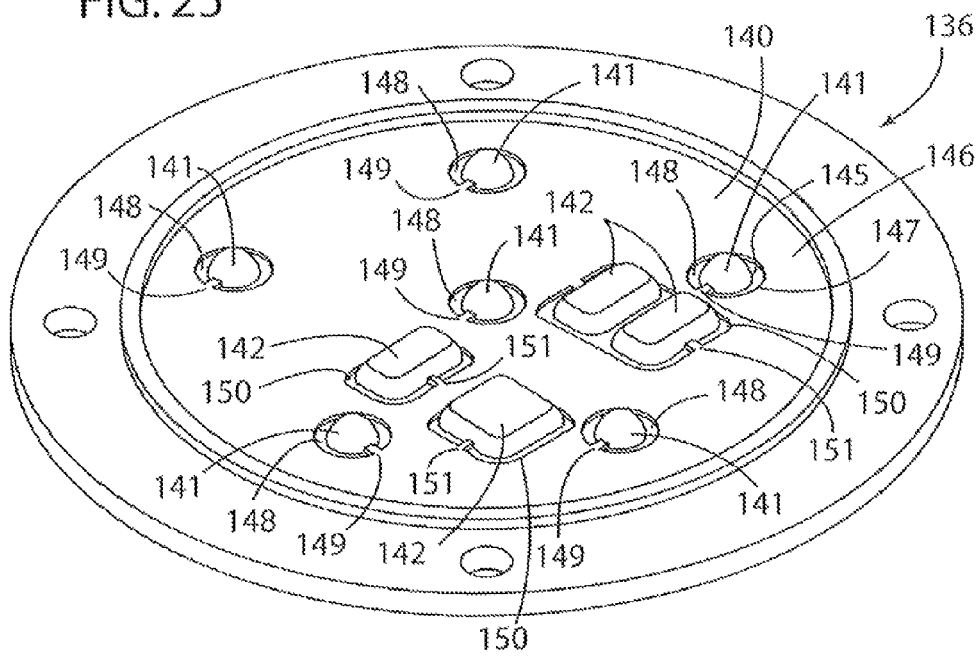

ELECTRICAL DEVICE HAVING BOARDLESS ELECTRICAL COMPONENT MOUNTING ARRANGEMENT

CROSS-REFERENCE TO RELATED APPLICATIONS

This application is a divisional of U.S. patent application Ser. No. 11/842,606, filed on Aug. 21, 2007, now U.S. Pat. No. 7,909,482 entitled ELECTRICAL DEVICE HAVING BOARDLESS ELECTRICAL COMPONENT MOUNTING ARRANGEMENT, which claims the benefit of U.S. Provisional Application No. 60/838,982, filed on Aug. 21, 2006, entitled ELECTRICAL DEVICE HAVING BOARDLESS ELECTRICAL COMPONENT MOUNTING ARRANGEMENT, the entire contents each of which are incorporated by reference.

BACKGROUND OF THE INVENTION

Electrical circuit boards have been utilized in a very wide range of applications for physically and electrically interconnecting various electrical components such as integrated circuits, LEDs, resistors, capacitors, inductors, and the like. Although electrical circuit boards have been widely used, circuit boards may present various drawbacks/disadvantages. Nevertheless, integrated circuit boards have continued to be used in a wide range of applications.

SUMMARY OF THE INVENTION

The present invention relates to an electrical device that includes one or more electrical components that are interconnected by a circuit conductor without use of a circuit board, and a method of making such a device. The device is made by providing an electrically conductive material that forms an electrical circuit. The electrical circuit material may be made from a sheet of conductive metal or the like that is cut and/or formed utilizing a "progressive die" or other suitable arrangement. According to one aspect of the present invention, the electrical circuit may be positioned in a first mold, and one or more pockets or cavities are formed by molding plastic material onto the electrically conductive material. Portions of the electrical circuit are left exposed in the pockets. One or more electrical components are positioned in the pockets in electrical contact with exposed surfaces of the conductive circuit material, and the part is then positioned in a second mold. Molten plastic is then injected around the electrical components to thereby at least partially encapsulate the components and physically interconnect them to the previously-formed part.

According to another aspect of the present invention, an electrical assembly such as a light may be formed by cutting a sheet of conductive material to form a sheet metal circuit having at least two electrically conductive circuit elements. Each of the circuit elements has first and second opposite sides. The method includes securing at least one electrical component to the first side of the circuit element by soldering, crimping, or other suitable technique. The circuit and electrical component are positioned in a first mold cavity that defines a first shape. Thermoplastic polymer material is molded around the electrical component while it is in the first mold cavity to thereby encapsulate the electrical component in a protective capsule of polymer material. The protective capsule of polymer material may have a first portion in contact with the first side of the conductive circuit elements around the electrical component. The protective capsule has peripheral edge portions extending around at least a portion of the electrical component. The circuit element and electrical component are then positioned in a second mold cavity having a second shape that is substantially different than the first shape. Additional thermoplastic polymer material is then molded over at least a portion of the protective capsule. Additional material may subsequently be molded over the part utilizing third, fourth, or more mold tools/steps.

Yet another aspect of the present invention is an electrical device such as a light assembly including a sheet metal circuit with at least two electrically conductive circuit elements. Each of the circuit elements defines opposite side surfaces. At least one electrical component such as an LED is electrically connected to the circuit elements. At least one additional electrical component is also electrically connected to the circuit elements. The additional electrical component is selected from a group including a resistor, a diode, a zener diode, a transistor, an integrated circuit, an inductor, a transient voltage suppressor, and a metal oxide varistor. The additional electrical component is capable of affecting at least one of the voltage and electrical current supplied to the LED or other electrical components. A one-piece body comprising thermoplastic polymer material encases the first electrical component or LED, and the additional electrical component. At least a portion of the opposite side surfaces of the circuit elements are encased by the one-piece body.

Yet another aspect of the present invention is a mold tool for overmolding electrical components that are mounted to a conductive circuit element. The mold tool includes first and second mold parts that are configured to operably engage one another. The first mold part has a first contact surface configured to contact a first side of a generally flat conductive circuit element positioned in the mold tool. The second mold part has a first cavity portion and a sealing surface extending around the cavity. The sealing surface is configured to contact a second side of a generally flat conductive circuit element positioned in the mold tool. The second mold part has a second cavity portion connected to the first cavity portion by a passageway that permits flow of molten polymer material from the second cavity portion to the first cavity portion.

In this way, a wide variety of devices may be formed having either partially or fully encapsulated electrical components without the use of an electrical circuit board. Significantly, the electrically conductive circuit material may be formed into a variety of non-planar shapes, and the plastic material injected around the conductive circuit material may be formed into a virtually infinite number of configurations. The plastic material injected around the metal conductive material may be used to provide a finished surface for an assembly such as a vehicle interior light, dashboard component, or other like. Also, the electrically conductive material and the plastic material encapsulating the electrically conductive material may form a part of the housing for the vehicle light or other such assembly, such that a separate housing and circuit board is not required. Because the circuit material can be formed into virtually any shape, the configuration of the final part is not constrained by the need to provide for a planar circuit board.

These and other features, advantages, and objects of the present invention will be further understood and appreciated by those skilled in the art by reference to the following specification, claims, and appended drawings.

BRIEF DESCRIPTION OF THE DRAWINGS

FIG. 7;

FIG. 15 is an isometric view of an electrical device according to another aspect of the present invention;

FIG. 16 is an isometric view of the device of FIG. 15 taken from a different point of view;

FIG. 17 is a side elevational view of the device of FIGS. 15 and 16;

FIG. 24 is a perspective view of the device of FIG. 15 during an intermediate stage of the fabrication process showing the internal components encapsulated by translucent polymer material;

FIG. 25 is a perspective view of the device of FIG. 15 during an intermediate stage of the fabrication process showing the internal components encapsulated by polymer material;

DETAILED DESCRIPTION OF PREFERRED EMBODIMENT

Figure 1:
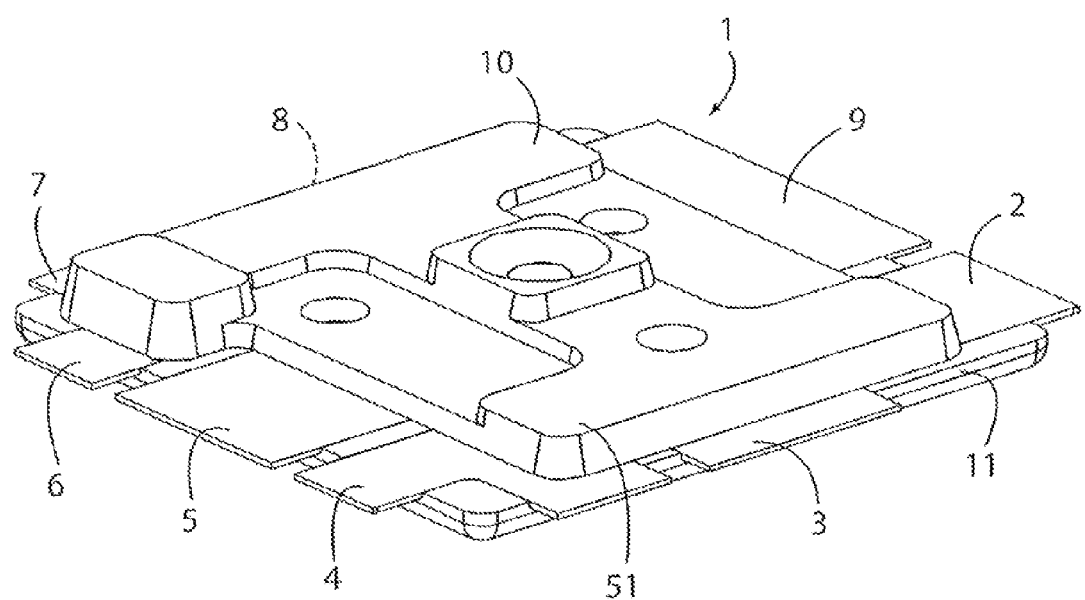
FIG. 1 is an isometric view of a finished part according to one aspect of the present invention.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 2:
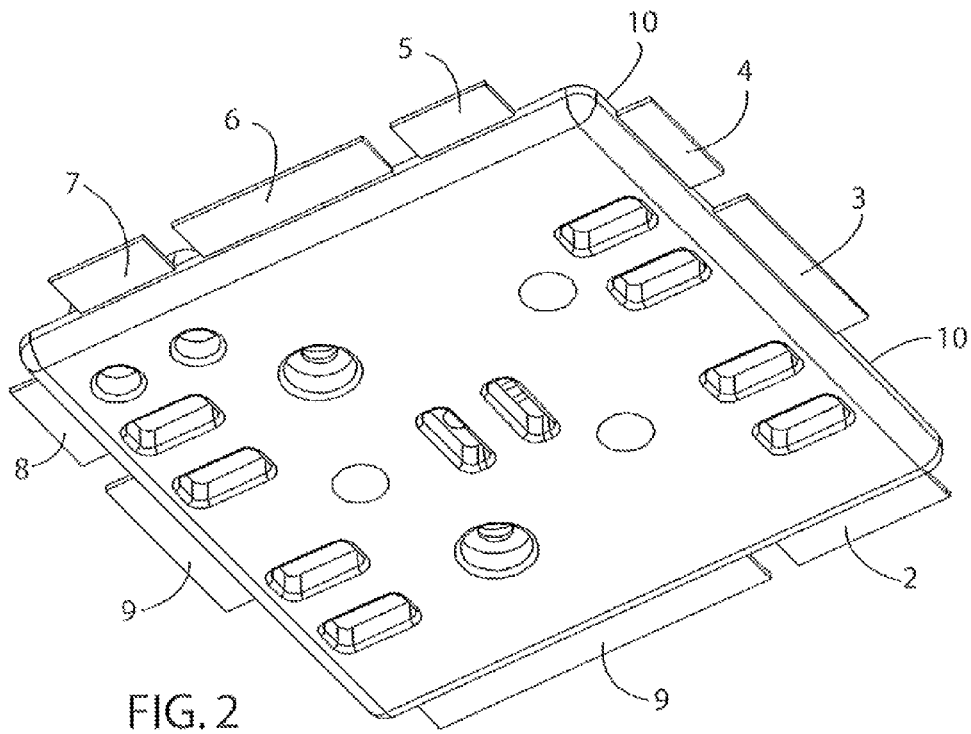
FIG. 2 is an isometric view of the completed part of FIG. 1 from a different angle.
Figure 4:
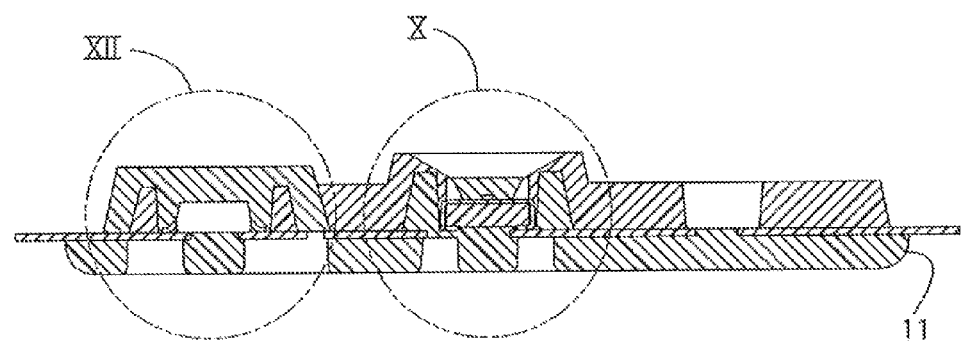
FIG. 4 is a cross-sectional view of the completed part of FIG. 3 taken along the line IV-IV.
Figure 3:
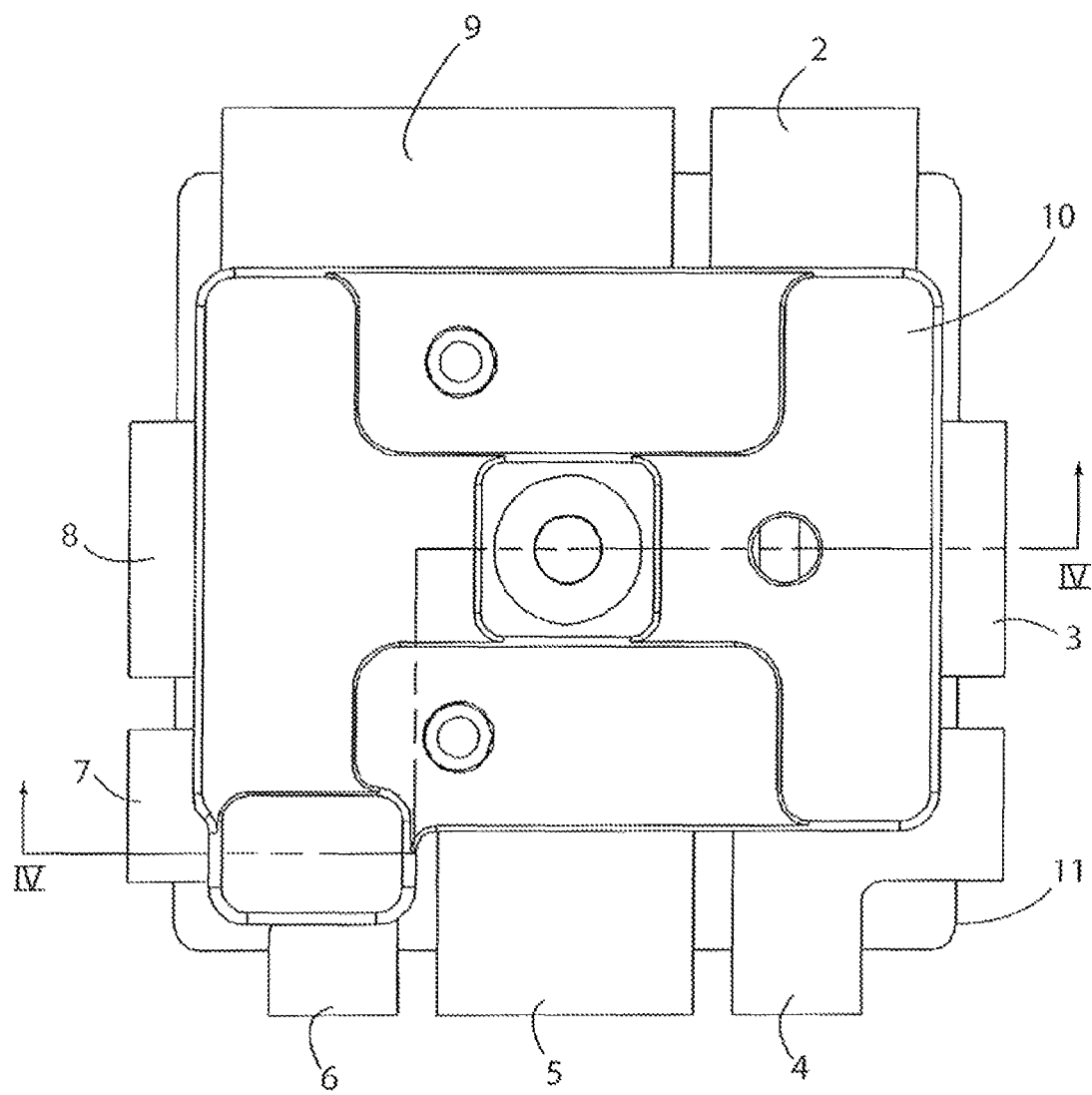
FIG. 3 is a plan view of the completed part of FIG. 1.

With reference to FIGS. 1-3, an electrical device 1 according to one aspect of the present invention includes electrical conductors 2-9 (see also FIGS. 2 and 3) that are embedded in a non-conductive plastic material 10. In the illustrated example, the electrical conductors 2-9 are made from sheet metal such as plated steel, brass, or the like, and include relatively large portions extending beyond the perimeter 11 of the plastic material 10. As described in more detail below, one or more electrical components such as an integrated circuit, LED, resistor, diode, capacitor, conductor, or virtually any other electrical component or components are at least partially encapsulated within the plastic material 10 in electrical and thermal contact with the electrical conductors 2-9. The configuration of the electrical conductors 2-9 in the illustrated example provides for heat conduction from the electrical components embedded in the plastic material 10. However, it will be understood that the electrical conductors utilized to provide electrical connections to the embedded circuit components may have virtually any size, shape, or configuration, and may include a relatively small exposed external surface to provide for electrical and/or thermal connections. Still further, rather than having exposed portions of the electrical conductors 2-9, the electrical conductors may be completely encapsulated in the plastic material 10, and an electrical connector of a conventional, known configuration may be electrically connected to one or more of the electrical conductors 2-9 and embedded within the plastic material 10, such that the conventional electrical plug or other known connector may be the sole external electrical connecting feature for the electrical conductors 2-9.

Figure 5:
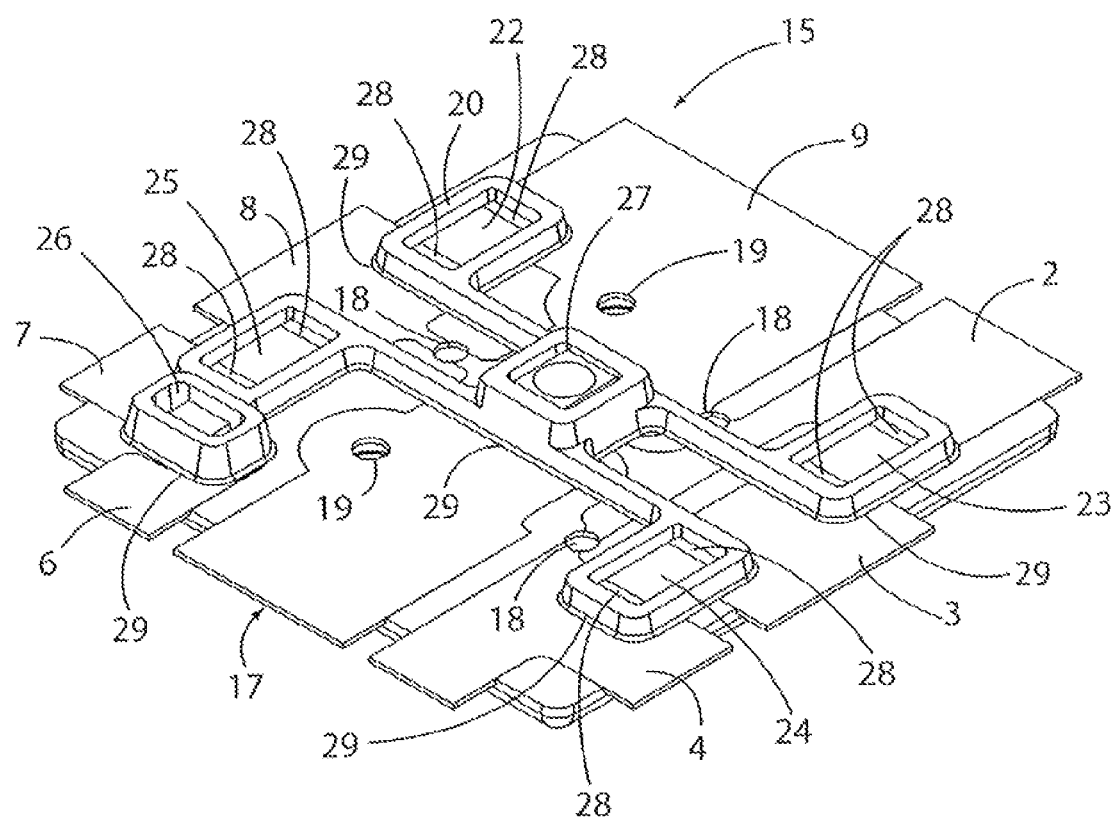
FIG. 5 is an isometric view of a "first shot part" showing pockets formed by a first injection molding step.
Figure 6:
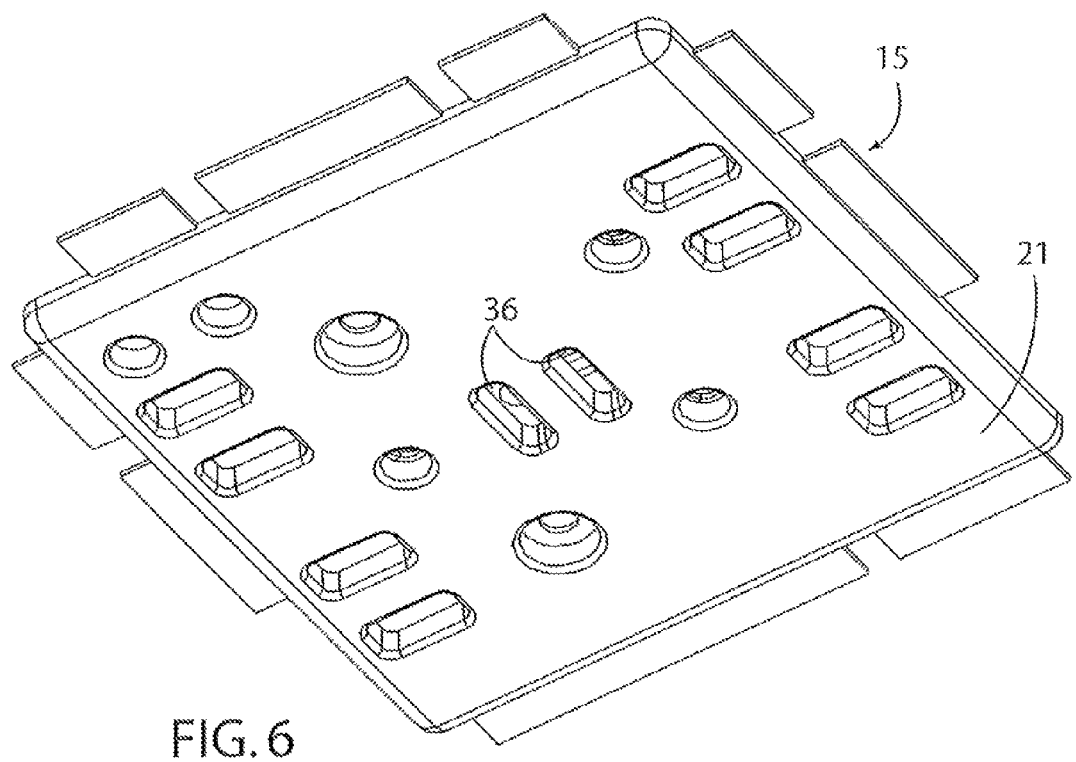
FIG. 6 is an isometric view of the first shot part of FIG. 5 from a different angle.
Figure 7:
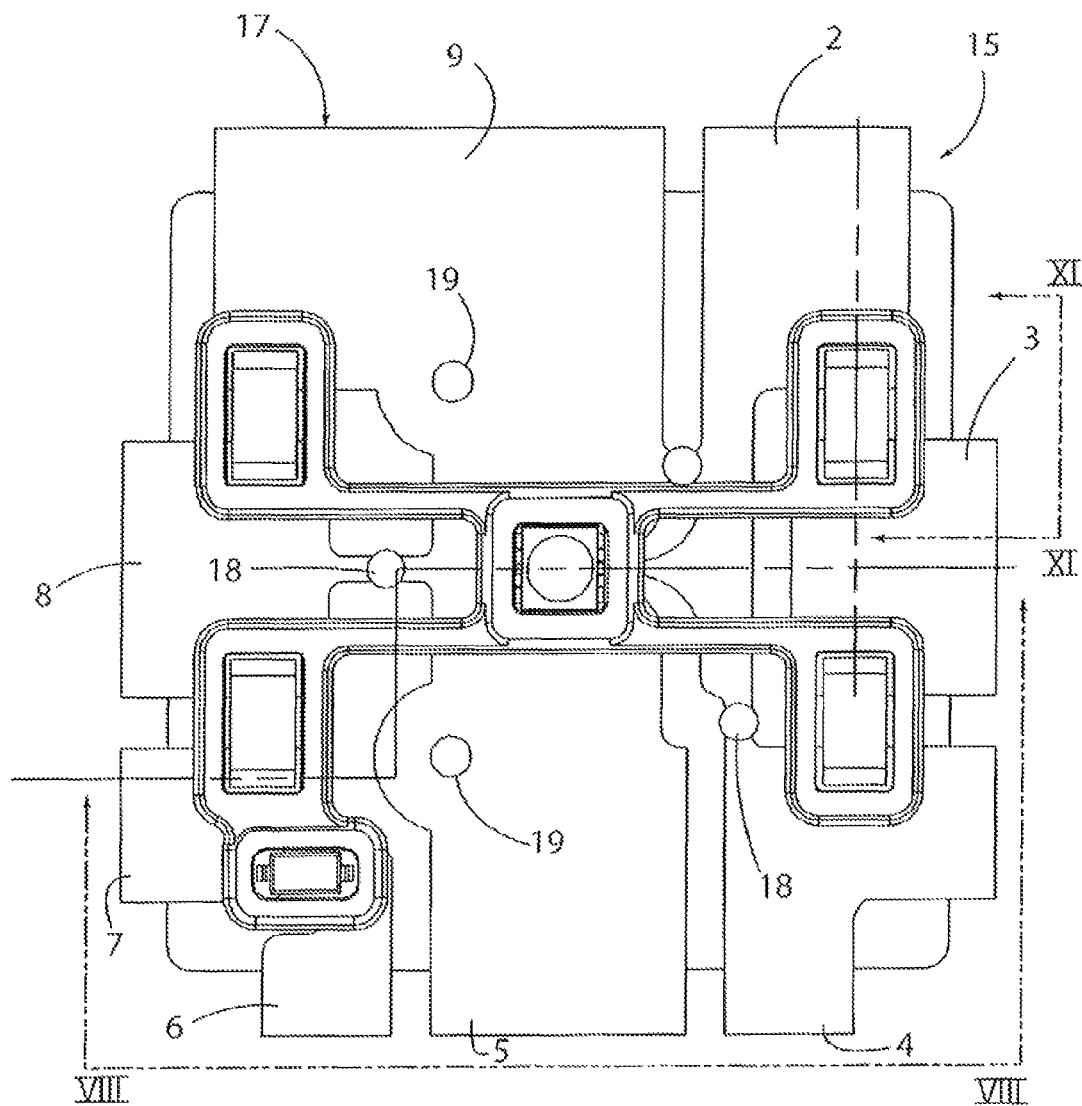
FIG. 7 is a plan view of the first shot part of FIG. 5.

With reference to FIGS. 5-7, during fabrication of the electrical device 1 according to a first method, a "first shot part" 15 may initially be formed. When utilizing this method, the first shot part 15 is made by placing a web 17 of electrically conductive material into a first mold (not shown). The web 17 is formed from sheet metal or the like in a progressive die or the like. In the illustrated example, the web 17 and electrical conductors 2-9 (made from the web 17) have a substantially planar shape. However, it will be understood that the web 17 and electrical conductors formed from the web 17 may have virtually any shape as required for a given application. Furthermore, it will be understood that the electrical conductors may be made from materials other than sheet metal utilizing a range of forming processes as required for a particular application.

The web 17 is initially formed as a one-piece part with a plurality of connecting portions 18 that physically and electrically interconnect the electrical conductors 2-9. One or more locating holes 19 are also formed in the web 17 by the progressive die. The web 17 may be interconnected with adjacent webs 17 (not shown) by a plurality of metal web connecting parts (not shown) to thereby form an elongated strip of material having a plurality of individual web parts 17. The web 17 is positioned in a first mold tool (not shown), and pins or the like (also not shown) are received in locating holes 19 to position the web 17 in a tool that cuts the connecting portions 18 to thereby electrically and physically separate the electrical conductors 2-9 from one another. The web 17 may also be cut apart from the adjacent web 17 if desired for a particular application. Nevertheless, in a preferred method, the web 17 remains interconnected to the web section 17 immediately adjacent thereto.

After the web 17 is positioned in a first mold tool, the mold parts are brought together, molten plastic material is injected to form raised walls or ridges 20 and a lower plastic portion 21 (FIG. 6). The walls or ridges 20 form a plurality of pockets 22-27. Each of the pockets includes exposed conductive surfaces 28 that are formed by the electrical conductors 2-9. It will be understood that the mold cavity (not shown) has substantially the same shape as the external surfaces of the raised walls/ridges 20 and lower plastic 21, and the mold includes surfaces that tightly abut the electrical conductors 2-9 around the base edges 29 of the raised walls/ridges 20 to thereby prevent flow of the plastic material beyond the configuration shown in FIGS. 5-7.

Figure 8:
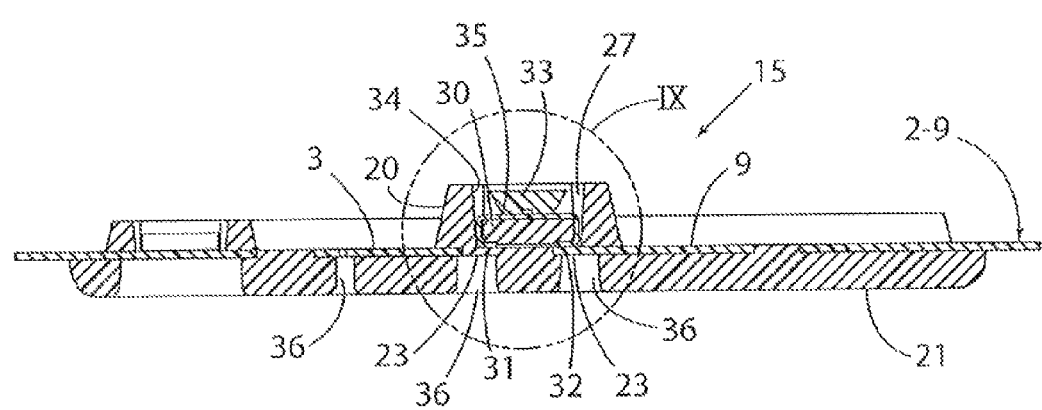
FIG. 8 is a cross-sectional view of the first shot part of FIG. 7 taken along the line VIII-VIII.
Figure 9:
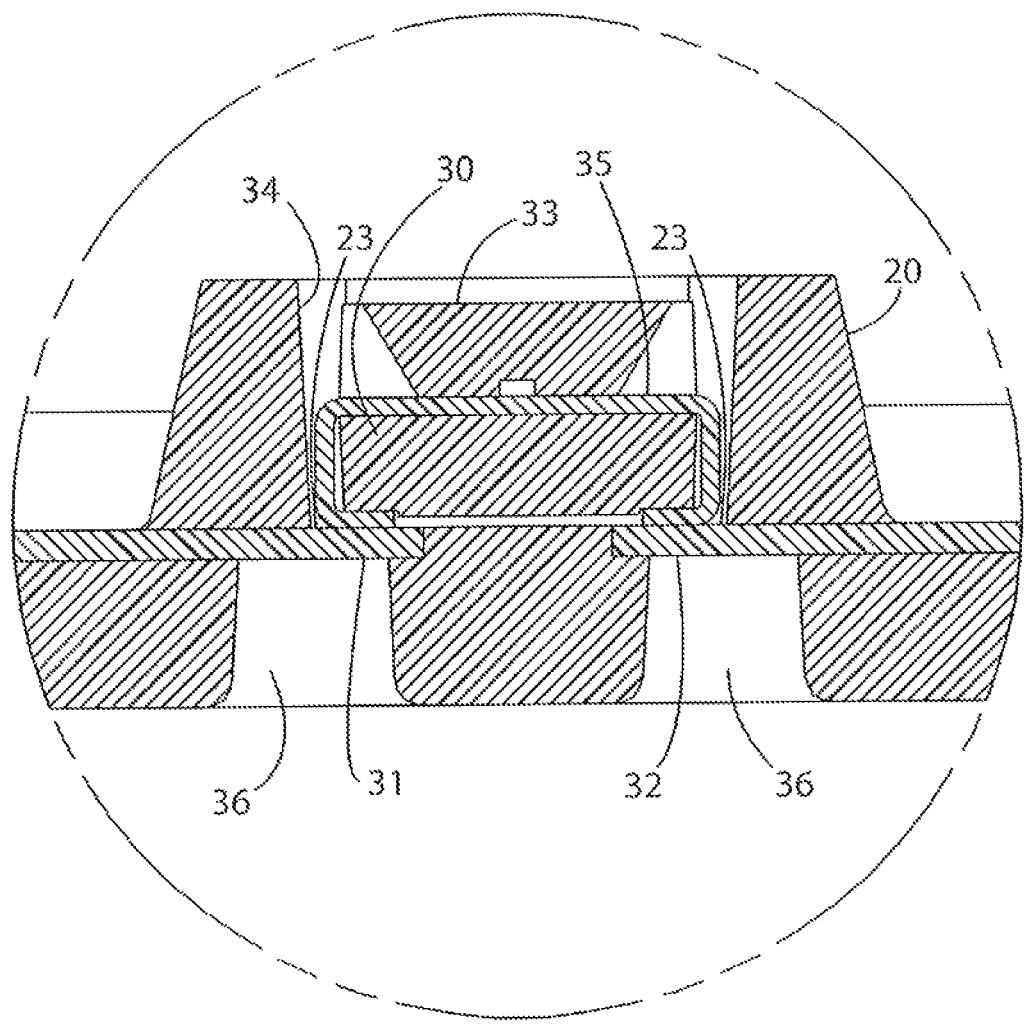
FIG. 9 is an enlarged view of a portion of the first shot part of FIG. 8.

After the first shot part is formed, various electrical components are placed in the pockets 22-27 formed by the raised walls or ridges 20. With further reference to FIGS. 8 and 9, an example of one such electrical component is an LED 30 that is positioned in pocket 27 with conductors 31 and 32 of LED 30 in contact with exposed portions 23 of electrical conductors 3 and 9. The exposed portions 23 of the conductors within the pockets 22-27 are preferably coated with grease or the like to both hold the electrical component in place, and to ensure that the electrical component such as LED 30 is in thermal contact with the electrical conductors. It will be appreciated that the LED 30 is retained in position by the inner surfaces 34 of walls or ridges 20. Although the size of the pocket 27 (or pockets 22-26) may be chosen such that the LED 30 or other electrical component can move side-to-side to some degree, the inner surfaces 34 of raised walls or ridges 20 are preferably formed with a high enough degree of accuracy to ensure that the LED 30 or other electrical component is positioned within tolerance for the final part, such that additional side-to-side positioning features/tooling and the like are not required. Furthermore, the grease (not shown) or other material that helps retain the LED 30 in contact with the conductive material ensures that the out of plane tolerance (i.e., up/down in FIG. 8) remains within tolerance. In the illustrated example, a plug or the like 33 is positioned on upper surface 35 of LED 30. During the first shot molding process, one or more locating pins or other features (not shown) in the mold contact the web 17 to support the web 17 in the mold. These parts form one or more cavities 36 in the first shot part 15.

Figure 10:
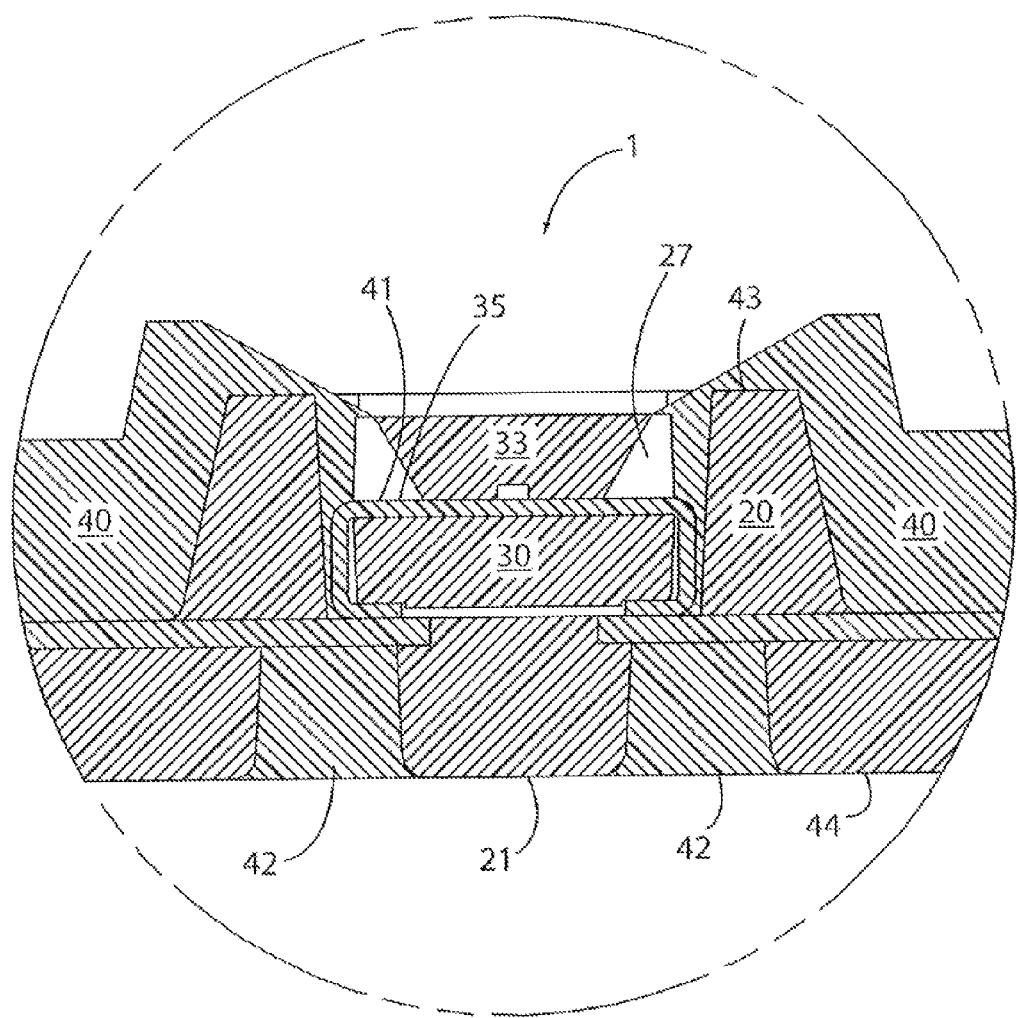
FIG. 10 is an enlarged view of the completed part corresponding to the first shot part of FIG. 9.

With further reference to FIG. 10, after the LED 30 is positioned in cavity 27 formed by walls 20 by an electrical component placement device or machine (not shown), the first shot part 15 is placed in a second mold tool (also not shown), and additional plastic material 40 is injected to at least partially encapsulate the LED 30 at contact areas 41 between the LED 30 and plastic material 40. In this way, the LED 30 is securely positioned in cavity 27. The plug or tooling part 33 may then be removed to expose the upper surface 35 of LED 30. The open area previously occupied by tooling part 33 provides for unimpeded projection of light from LED 30. Plastic material 42 may be injected to fill cavities 36 (FIG. 9) formed by the part-locating features of the first mold tool. Alternately, the cavities 36 may simply be left unfilled if desired for a particular application. It will be appreciated that a clear boundary 43 between plastic 20 and plastic 40 is shown in FIG. 10, the plastic 20 and 40 may melt together at least somewhat during the second shot molding operation, such that the plastic materials 20 and 40 are fused together, forming an integral one-piece structure. If desired for a particular application, the first shot plastic material 20 may be a different material than the second shot plastic material 40. For example, the first shot material 20 could be opaque to provide a finished surface 44 having the desired appearance, and the second shot material 40 could be transparent or light-transmitting translucent colored plastic to provide for light transmission through the plastic material 40.

Figure 11:
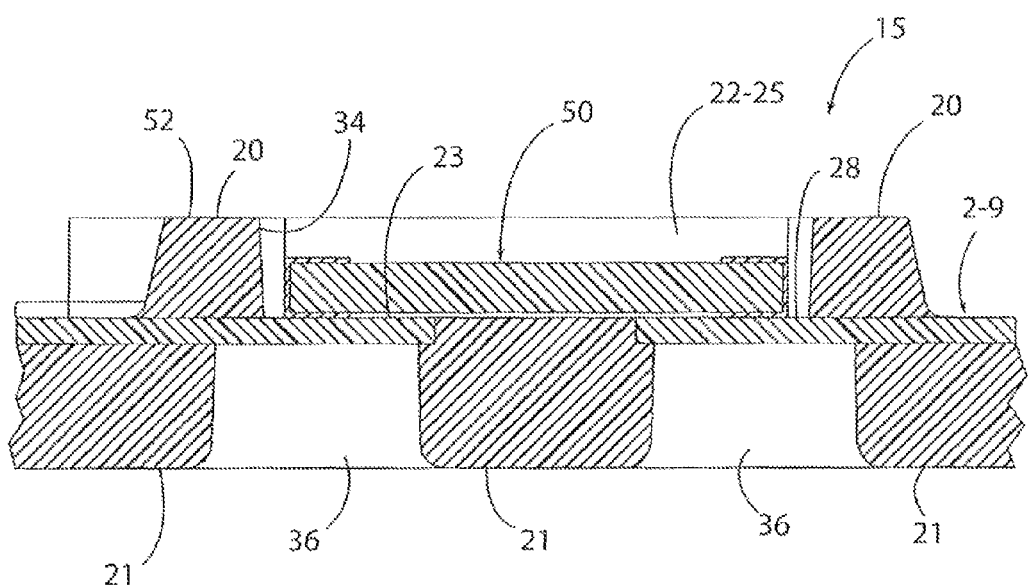
FIG. 11 is a cross-sectional view of the first shot part taken along the line XI-XI.

With further reference to FIG. 11, resistors 50 are positioned in pockets 22-25 in electrical contact with selected ones of the electrical conductors 2-9. The resistors 50 are retained in position within tolerance by the side walls 34 of raised walls or ridges 20, and a thin layer of grease or other material (not shown) is utilized to help retain the physical and electrical contact between the resistors 50 and the electrical conductors 2-9. After resistor 50 is positioned in a pocket as illustrated in FIG. 11, substantially the entire pocket 22-25 may be filled with plastic material 51 (FIG. 1) to fully encapsulate the resistor 50. Cavities 36 may also be filled with plastic material during the second shot mold step. It will be appreciated that the plastic material 51 may not only fill the cavities 22-25, but it may also fully encapsulate the ridges 20, thereby covering at least a portion of outer surfaces 52 of ridges 20.

Figure 12:
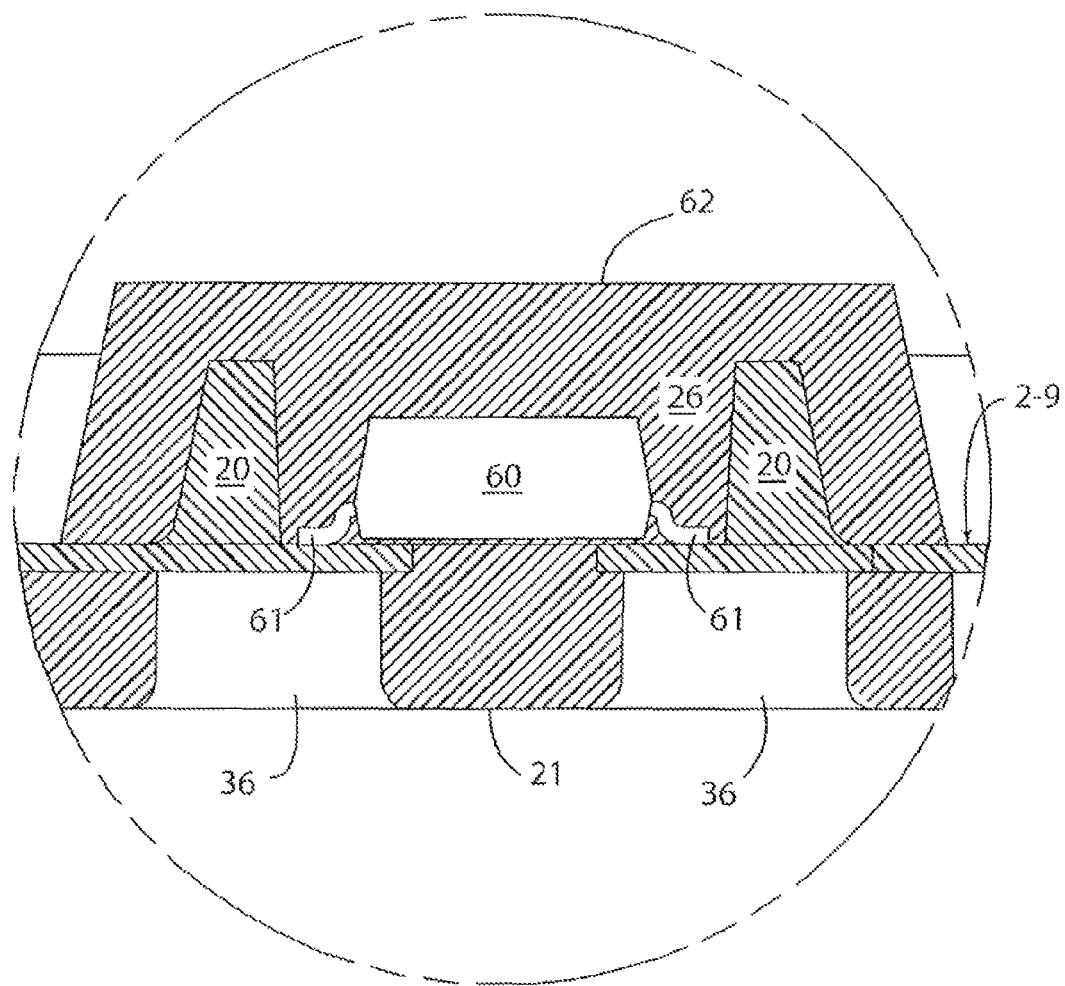
FIG. 12 is an enlarged view of a portion of the completed part of FIG. 4.

With further reference to FIG. 12, a diode 60 may be positioned in cavity 26 with electrical contacts 61 of diode 60 in contact with selected ones of the electrical conductors 2-9. Cavity 26 is then filled with plastic material 62 during the second shot of the molding operation. The cavities 36 may optionally be filled with plastic material during the second shot of the molding operation.

Figure 1A:
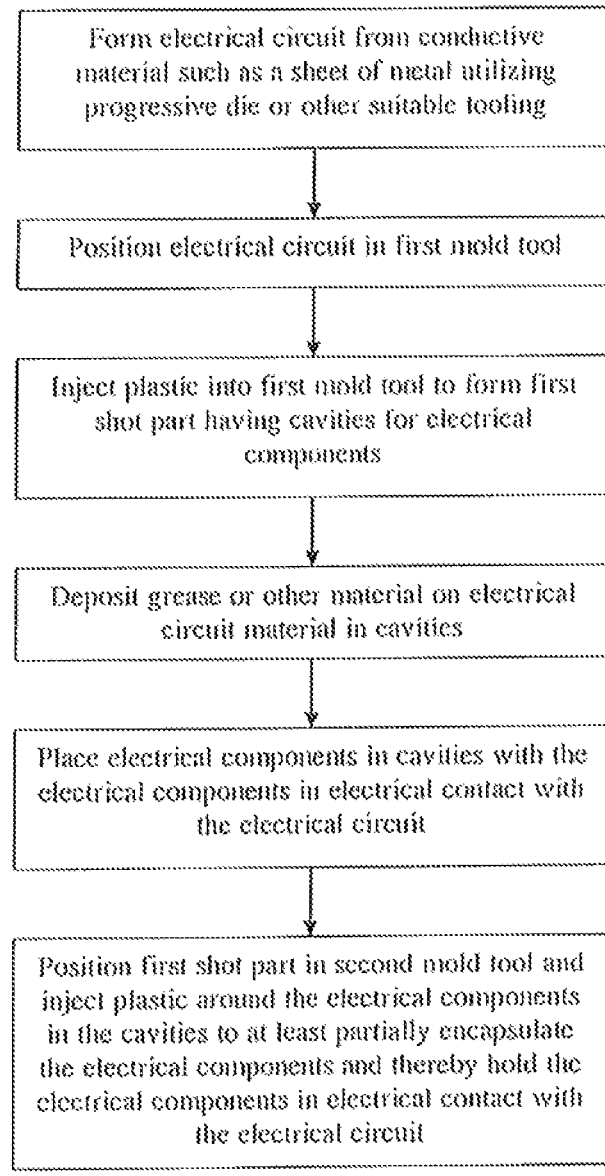
FIG. 1A is a flow chart showing the process of making the electrical device of FIG. 1.

With reference back to FIG. 1A, the process of forming electrical device 1 according to one aspect of the present invention includes forming an electrical circuit from conductive material such as a sheet of metal. If a sheet of metal is utilized, the circuit may be formed utilizing a progressive die or other suitable tooling. However, it will be understood that the electrical circuit may be formed from a wide variety of conductive materials utilizing a wide variety of processes/techniques, and the illustrated example utilizing sheet metal formed in a progressive die is but one example of a suitable process/component. The electrical circuit is positioned in a first mold tool. As discussed above, locating holes 19 are preferably formed in web 17, and the locating holes 19 are utilized to position the web 17 in the first mold tool. As also described above, the first mold tool may include a plurality of locating surfaces that contact the web 17 to position the web 17 in the first molding tool, and thereby form cavities 36 during the first shot mold process in the first mold tool. Molten plastic is then injected into the mold cavity to form the raised ridges or walls 20, and the lower plastic 21. It will be appreciated that the specific configuration of raised ridges 20 and lower plastic 21 is but one example of a virtually unlimited number of possible configurations that may be formed during the first shot molding step.

Figure 13:
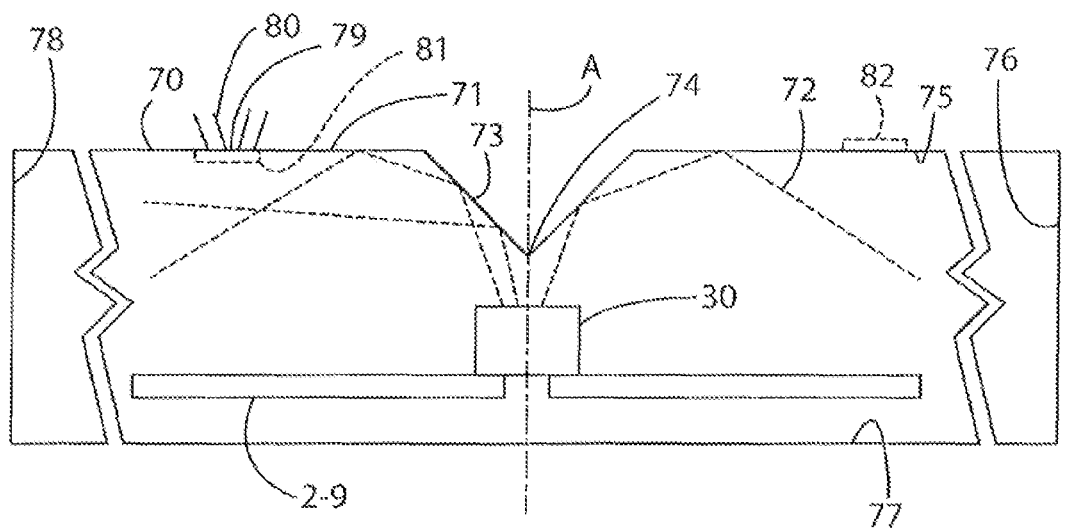
FIG. 13 is a fragmentary, partially cross-sectional view of a portion of a device according to another aspect of the present invention.

With further reference to FIG. 13, LED 30 may be embedded in plastic material 70 formed during the first or second shot molding step. Plastic material 70 may be transparent or translucent to permit light rays 72 to propagate within the material 70. Outer surface 71 of plastic 70 defines a cone 73 having a vertex (point) 74 directly centered above the LED 30. The light rays 72 emitted by LED 30 contact the conical surface 73 and refract inwardly, and are therefore "trapped" within the plastic material 70. It will be appreciated that the positioning of LED 30 relative to the conical surface 73, as well as the geometry of cone 73 is chosen to ensure that the light rays 72 are refracted internally. It will also be understood that although a conical surface 73 is preferred, other surfaces could also be utilized to refract the light, or a substantial portion thereof, internally. For example, a pyramid-type surface or the like could be utilized to refract the light internally. Furthermore, a variety of curved or other irregular surfaces could also be utilized to internally refract at least a portion of the light emitted by LED 30.

The inner surfaces 75-78 of plastic material 70 are preferably smooth surfaces in most areas, such that the light rays 72 are refracted internally, rather than diffusing as would be the case if the surfaces 75-78 were irregular or rough surfaces. The plastic material 70 includes one or more rough surface areas 79 having a frosted, or other light-diffusing property, such that the light rays 72 are diffused and "escape" from within plastic material 70 when the light rays 72 hit the rough areas 79. The rough areas 79 may be positioned a significant distance from an axis A along which light from LED 30 is initially directed. The rough surface areas 79 "light up," and may form lettering, designs, or the like that are illuminated by LED 30. Because the light rays 72 are refracted internally in areas away from rough surface areas 79, the light rays 72 are not visible to a viewer except for the light rays 72 that hit the rough surface areas 79 and escape as diffused light 80. Also, non-light transmitting material may be embedded in the plastic material 70 in the vicinity of LED 30 to form letters, designs, and other predefined patterns. For example, a thin layer of opaque material (not shown) may be embedded in the polymer material 70 between the LED 30 and the outer surface 71 (e.g., between LED 30 and vertex 74 of cone 73). Alternately, if polymer material 70 does not form a cone 73, but rather has an outer surface 71 that is generally flat, a sheet of opaque material may be embedded between the LED 30 and the surface 71. The layer of opaque material may include one or more apertures therethrough in the shape of a letter, design, or the like. The layer of opaque material blocks the light rays from LED 30 except for the aperture through the opaque material, such that a lighted pattern in the shape of the aperture is thereby formed.

In this way, the light rays emitted by LED 30 can be utilized to form a variety of devices such as warning lights, decorative signs, or the like having specific messages, patterns, designs, or the like formed by rough surface areas 79. It will be appreciated that a plurality of LEDs 30 may be embedded within a single piece of plastic material 70 if required for a particular application. Also, it will be appreciated that although some light rays 79 or portions thereof do escape from plastic material 70 through smooth surfaces 75-78, the smooth surfaces 75-78 refract a substantial portion of the light (e.g., approximately 80%), such that a high percentage of the light emitted by LED 30 exits the plastic material 70 at the rough surface areas 79. Also, although the rough surface area 79 is illustrated as being substantially flat, it will be readily appreciated that the rough surface areas 79 may be formed in a cavity or the like 81, or on a raised surface 82.

Figure 14:
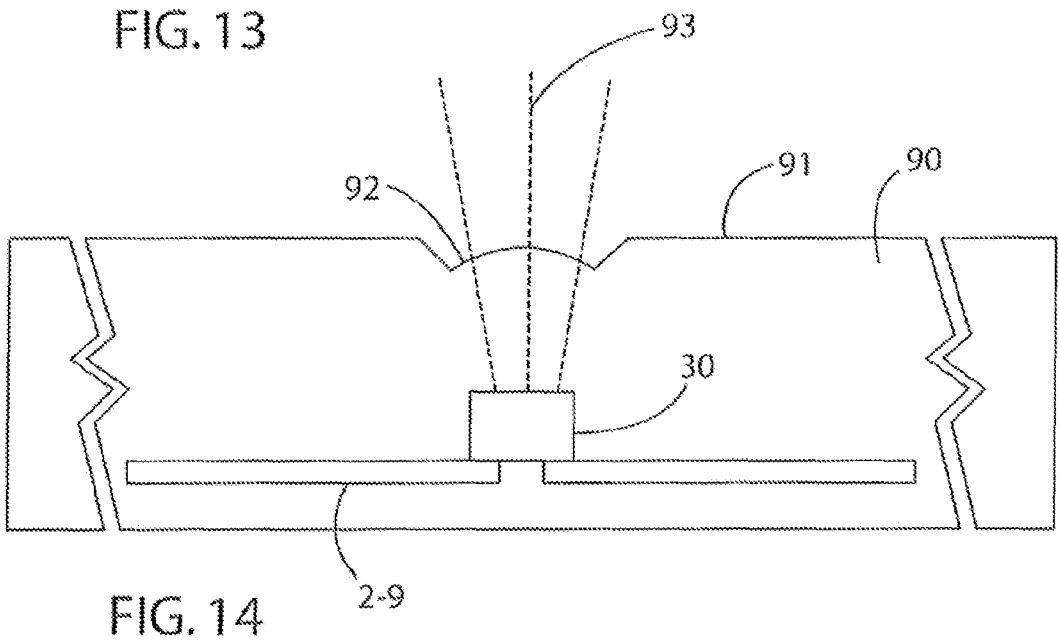
FIG. 14 is a fragmentary, partially cross-sectional view of a portion of a device according to another aspect of the present invention.

With further reference to FIG. 14, LED 30 may also be encapsulated in plastic material formed during the second shot of the molding process described above. Surface 91 of plastic material 90 may define a lens 92 directly in line with light rays 93 emitted by LED 30. In this way, the second shot of the molding process may be utilized to provide specific lens shapes that distribute the light 93 produced by LED 30 in a desired pattern. For example, the lens surface 92 may distribute the light to provide for interior task lighting for a motor vehicle or the like. It will be understood that the plastic material 90 may be transparent, translucent, or colored to provide the desired lighting effect.

The embedded LEDs of FIGS. 13 and 14 may be formed integrally with an electrical device 1 during the second shot of the molding operation. Alternately, the LED 30 may be molded into plastic 70 to form a separate component that is not part of an electrical device 1. It will be understood that the dimensions of the plastic material 70 and/or 90 may be chosen to form a component that is much larger than the LED 30 itself. For example, the plastic material 70 and/or 90 could be quite large relative to the LED 30, and the plastic material 90 itself may be utilized to mount the device to a larger component such as a vehicle dashboard, interior task light, or the like. In this way, the plastic material 70 and/or 90 may form a structural part of the finished product and/or the outer surfaces 71 and/or 91 may form a finished surface that is a substantial portion of the assembly to which it is assembled.

After the first shot part 15 is removed from the first mold tool, grease or other material may be deposited on exposed conductive surfaces 28 within the pockets 22-27. A tool or the like (not shown) then positions the various electrical components in the pockets or cavities 22-27, with the electrical contacts of the components in electrical contact with selected ones of the electrical conductors 2-9. The first shot part 15 is then positioned in the second mold tool, and additional plastic material is then injected around the electrical components to thereby at least partially encapsulate the electrical components and ensure that the electrical components remain in electrical and thermal contact with the electrical conductors 2-9.

With further reference to FIGS. 15-17, a device 100 according to another aspect of the present invention comprises an LED light assembly having an electrically conductive circuit 101 (see also FIG. 18) that is embedded in polymer material 102. The electrically conductive circuit 101 is preferably formed from sheet metal or the like utilizing a sheet metal stamping die to initially form a web as described in more detail above. In a preferred embodiment, the metal material utilized to form the circuit 101 has a thickness of at least about 0.003 inches thick, and more preferably at least about 0.008 inches thick. According to other aspects of the present invention, the circuit 101 may be thicker, and may be, for example, 0.010-0.020 inches thick, or thicker, depending upon the requirements for a particular application. In general, circuit 101 may be formed from material 0.25 inches thick or more. In general, material thicknesses greater than around 0.020 inches may be utilized if greater heat transfer capability is required for a particular application. In general, the circuit 101 comprises a material that is substantially thicker than the conductive material formed on conventional circuit boards.

The light assembly 100 includes a first side 103 (FIG. 15), and a second side 104 (FIG. 16). In the illustrated example, the first side 103 includes a first raised annular ridge 105, and a plurality of raised portions 106 forming lenses that control the distribution of light emitted from LEDs embedded within the polymer material 102 immediately adjacent the lens portions 106. Lens portions 106 may be configured as illustrated in, for example, FIGS. 13 and 14, or the raised portions 106 may have a shape as disclosed in U.S. Pat. No. 7,837,359, issued on Nov. 23, 2010, entitled LENS SYSTEM FOR LED LIGHTS, which claims the benefit of U.S. Provisional Patent Application No. 60/910,691, filed Apr. 9, 2007, entitled LENS SYSTEM FOR LED LIGHTS, the entire contents of which are incorporated by reference. In the illustrated example, the raised portions 106 comprise small dome-like structures having a smooth surface that distributes light from LEDs embedded in the polymer material 102 as described in detail below. The surfaces of the plastic material 102 adjacent and between the raised portions 106 may have a frosted or rough surface to provide for escape/distribution of light in substantially the same manner as described above in connection with FIG. 13. In this way, a relatively large portion of the surface of the polymer material 102 may be illuminated by the LEDs positioned immediately below raised portions 106. In the illustrated example, the polymer material 102 extends outwardly to form a flange 110 having a plurality of openings 111 therethrough. In use, the openings 111 receive threaded fasteners or the like to secure the light assembly 100 to a mounting structure or the like. In the illustrated example, the light assembly 100 comprises an exterior light assembly that is suitable for mounting to a motor vehicle or the like. The LED light assembly 100 may comprise a taillight for a semi-trailer or the like. The polymer material 102 forms a receptacle 112 on the second side 104. As described in more detail below, a plurality of prongs 113 of the circuit material 101 provide for connection to a 12 volt D.C. power source or the like of the motor vehicle. The polymer material 102 may form one or more ridges 114 that extend in a spoke-like manner and connect to a second annular ridge 115 that protrudes outwardly from the second side 104 of device 100.

Figure 18:
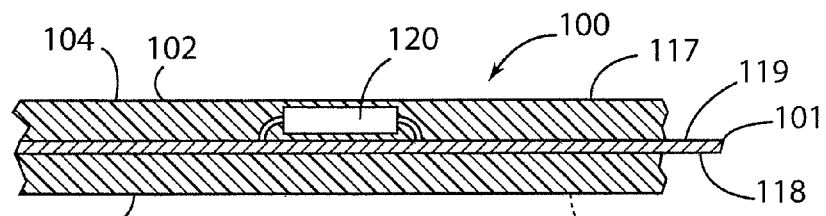
FIG. 18 is a partially fragmentary cross-sectional view of a portion of the device of FIG. 17.

With reference to FIG. 18, the electrical circuit material 101 is substantially encapsulated by the polymer material 102. Specifically, a first layer 116 of polymer material 102 covers a first side surface 118 of circuit 101, and a second layer 117 of polymer material 102 covers a second side 119 of circuit 101. One or more electrical components 120 are electrically and mechanically connected to the conductive circuit material 101, and the polymer material 102 encapsulates the electrical component(s) 120. The electrical component 120 may comprise a resistor, a diode, a zener diode, a transistor, an integrated circuit, an inductor, a capacitor, a transient voltage suppressor ("TVS"), a metal oxide varister ("MOV"), or virtually any other electrical circuit component. One or more of the electrical components 120 are connected to the circuit 101 to control the current and/or voltage supplied to the LEDs of the device 100.

Figure 19:
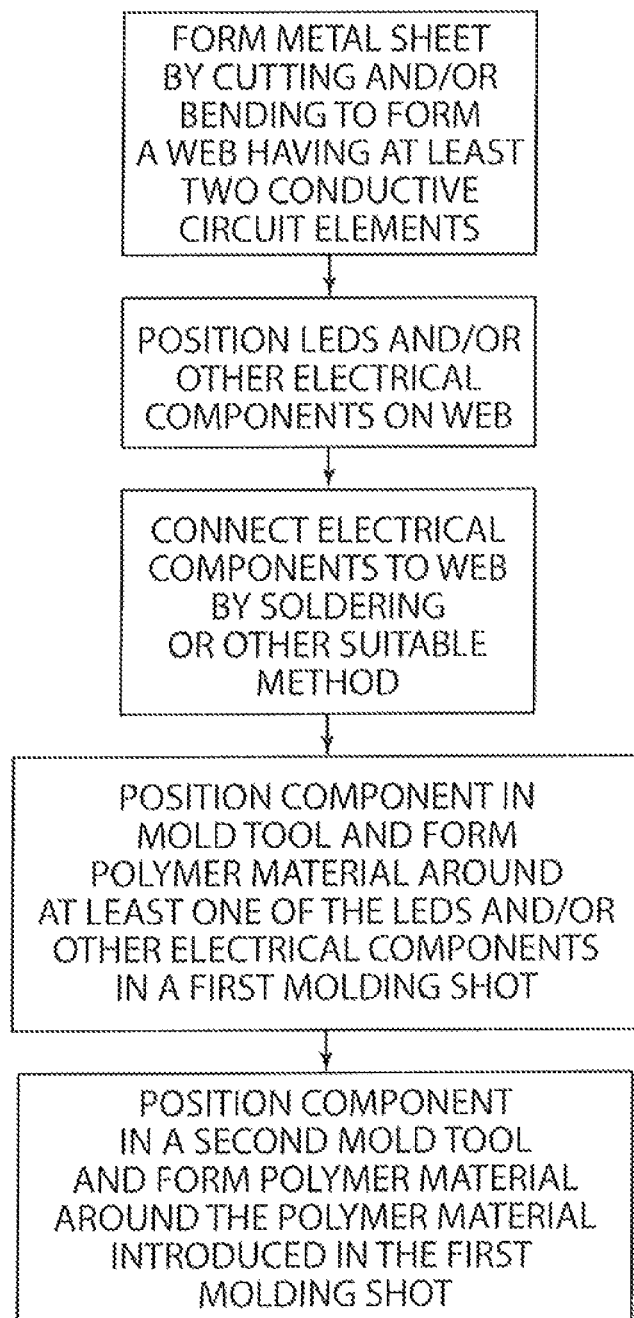
FIG. 19 is a diagram illustrating a method of making the device of FIG. 15.
Figure 21:
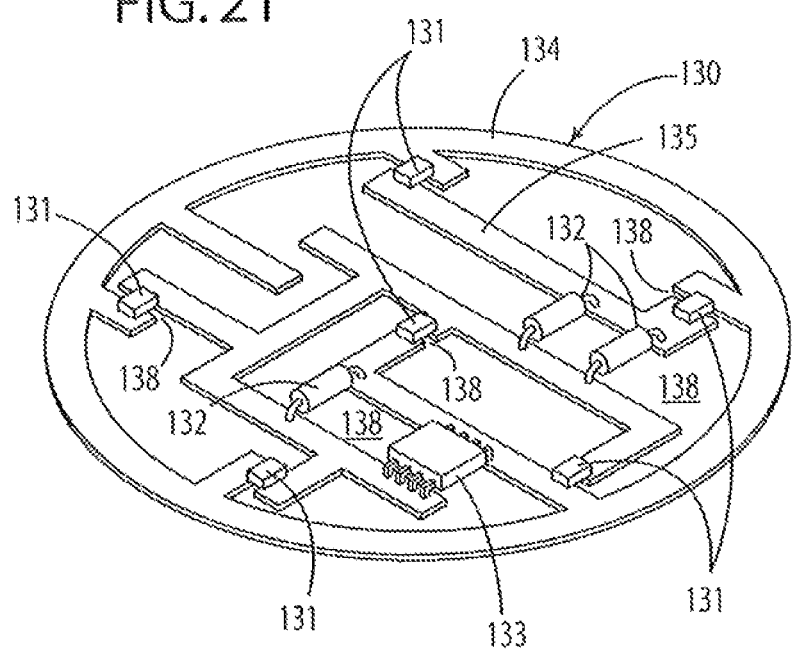
FIG. 21 is an isometric view of the circuit of FIG. 20 having electrical components attached thereto.
Figure 22:
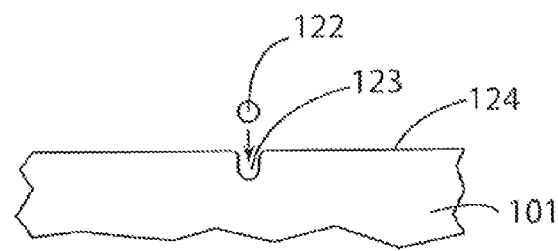
FIG. 22 is a fragmentary, partially schematic view showing one way to electrically and/or mechanically connect an electrical component to the circuit of FIG. 20.
Figure 23:
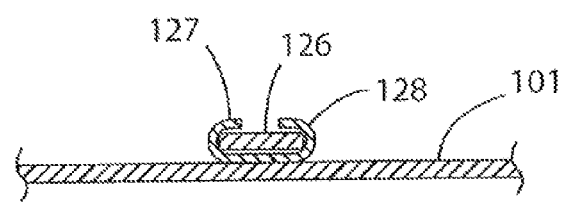
FIG. 23 is a partially schematic cross-sectional view showing another way to mechanically and/or electrically connect an electrical component to the circuit of FIG. 20.

With further reference to FIG. 19, during fabrication of device 100, sheet metal is first formed by cutting and/or bending the sheet metal to form a web 130 (FIG. 20) having at least two conductive circuit elements. As discussed in more detail above, the conductive circuit elements are preferably initially interconnected by small metal portions that are later cut or punched out to disconnect the conductive circuit elements from one another. After the web 130 is formed, LEDs 131 (FIG. 21) and/or other electrical components 132, 133 are positioned on the circuit elements of the web 130, and the LEDs 131 and/or other electrical components 132, 133 are then secured to the web 130. The LEDs 131 and/or other electrical components 132, 133 may be secured utilizing a soldering technique or other suitable method. With further reference to FIG. 22, one alternative to soldering includes positioning a lead 122 of an electrical component in a tapered notch 123 formed in an edge 124 of circuit material 101. The lead 122 may have a dimension that is the same as that of notch 123, or slightly greater than tapered notch 123, such that lead 122 forms a tight interference fit in tapered notch 123. Alternately, with reference to FIG. 23, a lead 126 of an electrical component may be secured to circuit material 101 by crimping tabs 127 and 128 around lead 126. It will be understood that other suitable connecting techniques may also be utilized according to the present invention.

With reference back to FIG. 19, after the LEDs 131 and/or other electrical components 132, 133 are secured to the web 130, the resulting component is positioned in a mold tool, and thermoplastic polymer material is molded around the LEDs 131 and/or other electrical components 132, 133 in a first molding shot. The method may, optionally, include positioning the component in a second mold tool, and additional polymer material may then be molded around the polymer material introduced in the first molding shot. Furthermore, third, fourth, fifth, or additional mold tools may also be utilized to mold additional polymer material around the polymer material formed during the first and second mold shots. It will be understood that a single mold shot process may be utilized according to other aspects of the present invention.

Figure 20:
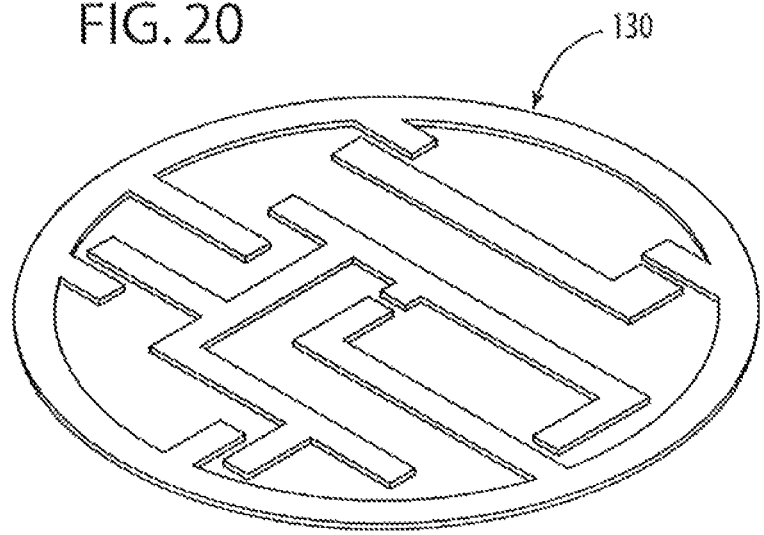
FIG. 20 is a perspective view of a conductive circuit element of the device of FIG. 15.

With further reference to FIG. 20, a conductive sheet of metal or other suitable material is first cut and/or formed to form an electrical web 130. With further reference to FIG. 21, after the circuit web 130 is formed, one or more LEDs 131 may be secured to the web 130 by soldering, or other suitable technique. In addition to the LEDs 131, additional circuit components 132 may be secured to the web 130 by soldering or other suitable technique. The circuit components 132 may comprise diodes, transistors, resistors, capacitors, or virtually any other electrical components utilized to form a circuit that supplies a desired current and/or voltage level to the LEDs 131 when the device 100 is connected to a 12 volt vehicle power supply. An integrated circuit 133 may also be connected to the web 130 utilizing soldering or other suitable technique.

Figure 26:
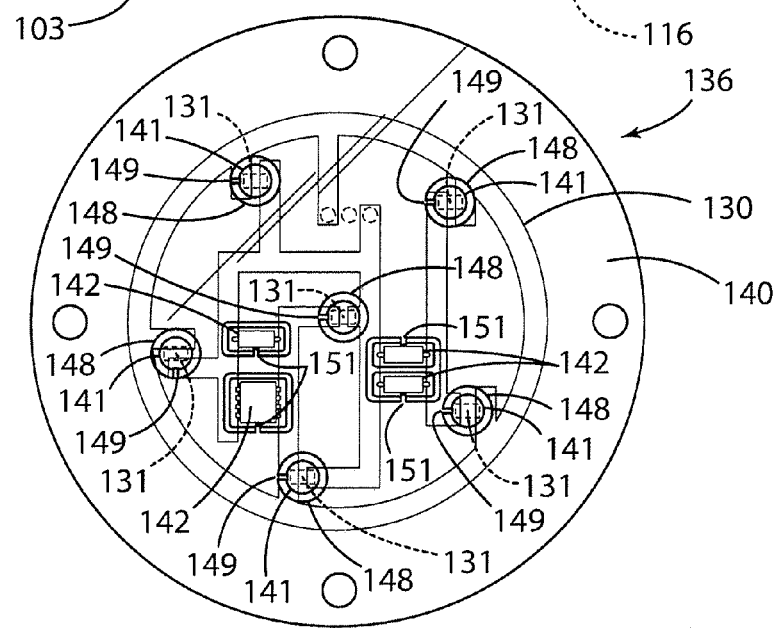
FIG. 26 is a plan view of the device of FIG. 15 during an intermediate stage of the fabrication process showing the internal components encapsulated by translucent polymer material.
Figure 27:
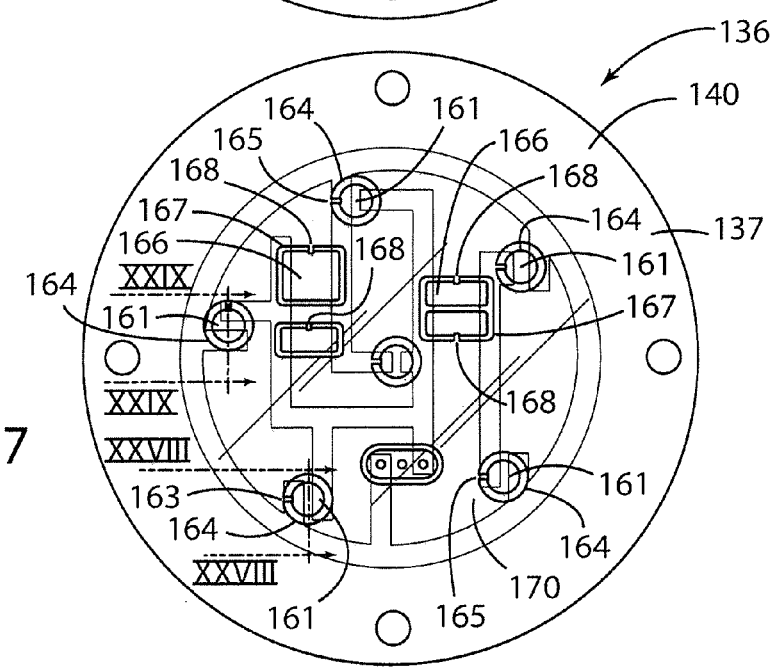
FIG. 27 is a plan view of the device of FIG. 15 during an intermediate stage of the fabrication process showing the internal components encapsulated by polymer material.

With further reference to FIG. 24, after the various electrical components are secured to the web 130 as illustrated in FIG. 21, the web 130 with the electrical components is then positioned in a first mold tool, and first thermoplastic polymer material 140 is then molded over the web 130 and around the diodes 131 and other electrical components 132 and/or integrated circuit 133 to form an intermediate part 136. In FIG. 24, the first polymer material 140 is shown as being substantially clear, such that the LEDs 131, electrical components 132 and integrated circuit 133 are visible through the second polymer material 140. In FIG. 25, the first polymer material 140 is illustrated as being substantially opaque to thereby illustrate the surface contour of the first polymer material 140. Similarly, in FIG. 26 the polymer material 140 is illustrated as being substantially clear, and in FIG. 27 the polymer material 140 is shown as being opaque. In a preferred embodiment, the first polymer material 140 comprises light-transmitting thermoplastic material that transmits light from the LEDs 131. In particular, LEDs 131 may comprise red LEDs, and the polymer material encapsulating the LEDs may also be red. Alternately, the LEDs 131 may be amber, and the polymer material may also be amber. Still further, the LEDs 131 may comprise white LEDs, and the polymer material may be substantially clear. Virtually any color LEDs and polymer material may be utilized according to the requirements of a particular application. Alternately, the LEDs of device 100 may be of different colors, such that device 100 produces light of different colors.

With reference to FIG. 25, the cavity of the first mold tool is configured to form protective capsules 141 of the polymer material 140 over the LEDs 131. Similarly, protective capsules 142 of polymer material 140 are also formed over the electrical components 132 and integrated circuit 133. In the illustrated example, the protective capsules 141 are dome-like in shape, and include a generally circular peripheral edge 145 having a maximum diameter of about 0.375 inches. A layer 146 of polymer material 140 is also formed over the web 130. The layer 146 includes a generally circular edge 147 that is spaced apart from circular peripheral edge 145 of protective capsules 141 to thereby form a C-shaped groove 148 that extends around the protective capsules 141. A small bridge portion 149 of the polymer material 140 extends between the layer of polymer material 146 to the protective capsule 141. As described in more detail below, the small bridge of material 149 is formed by a small passageway in the first mold tool that provides for flow of polymer material from the cavity forming layer 146 to the small cavity portion that forms the protective capsules 141.

Protective capsules 142 are similar to protective capsules 141, except that protective capsules 142 have a shape that generally corresponds to the circuit components 132 and/or integrated circuit 133. Each of the protective capsules 142 is surrounded by a groove 150 that is substantially similar to grooves 148, and each protective capsule 142 is connected to layer 146 of polymer material by a small bridge 151 that may be substantially similar to bridge 149 interconnecting protective capsules 141 with polymer material 146.

Figure 28:
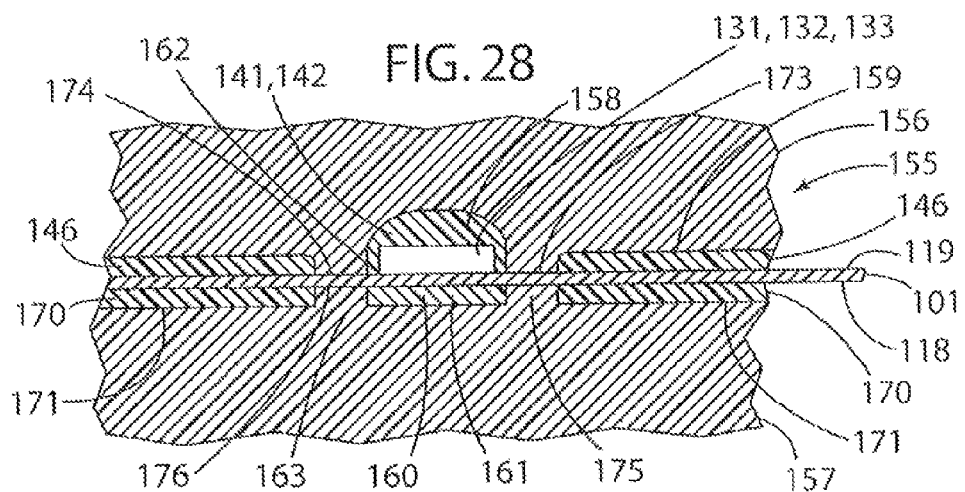
FIG. 28 is a cross-sectional view taken along the line XXVIII-XXVIII when the component of FIG. 27 is in a first mold tool.

With reference to FIG. 28, a first mold tool 155 utilized to fabricate the intermediate part 136 of FIGS. 24-27 includes a first mold part 156 and a second mold part 157. Web 130 may include a plurality of locating holes (not shown) or the like, and first mold tool 155 may include a plurality of pins that engage the openings to thereby position the circuit 101 in first mold tool 155. The first mold part 156 includes one or more first cavities 158 that form protective capsules 141 and/or 142 around LEDs 131 and/or electrical components 132 and 133. The first mold part 156 also includes a second cavity portion 159 that is utilized to form a layer 146 of polymer material on surface 119 of the web or circuit 101. Second mold part 157 includes a first cavity portion 160 that forms a small layer 161 of polymer material on surface 118 of circuit 101. In general, the small layer 161 may have a peripheral edge 163 that has substantially the same shape and size in plan view as peripheral edge 162 of protective capsule 141. With reference back to FIG. 27, the layer 161 of polymer material is formed on a bottom side 137 of the intermediate part 136, and a small bridge of plastic 165 connects the layer 161 with the layer 170 extending over lower side 137 of intermediate part 136. As shown in FIG. 28, layer 170 is formed by a second cavity portion 171 of second mold tool part 156.

Referring again to FIG. 28, first mold part 156 includes a ridge 173 that extends around first cavity portion 158. The ridge 173 includes a contact surface 174 that abuts or contacts surface 119 of circuit 101. In the illustrated example, contact surface 174 is substantially flat, and it fits closely against surface 119 of circuit element 101 to thereby form grooves 148 (see also FIG. 25) that extend around protective capsules 141. Similarly, second mold part 157 includes a ridge 175 extending around first cavity portion 160. A contact surface 176 formed by ridge 175 fits tightly against surface 118 of circuit element 101 to thereby form grooves 164 (see also FIG. 27) extending around the small layer 161 of polymer material on lower side 137 of intermediate part 136. The first mold part 156 and second mold part 157 may include a plurality of cavities surrounded by ridges/contact surfaces as required to form protective capsules 141 and 142 over each of the electrical components mounted to the circuit 101.

Figure 29:
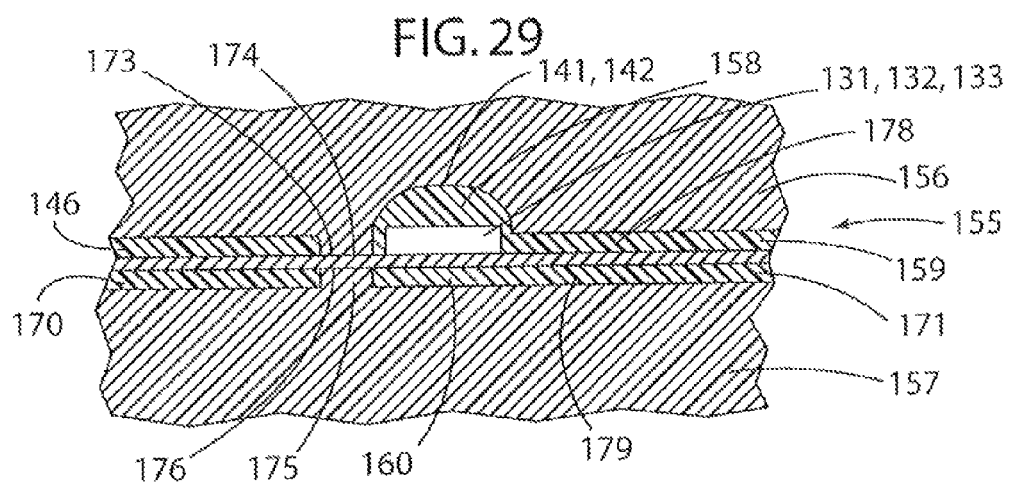
FIG. 29 is a cross-sectional view taken along the line XXIX-XXIX when the component of FIG. 27 is in a first mold tool.

With further reference to FIG. 29, first mold part 156 includes an elongated passageway 178 that interconnects first cavity portion 158 with second cavity portion 159. When thermoplastic polymer material is injected into the second cavity portion 159, the polymer material flows through the elongated passageway 178 and into the first cavity portion 158 to thereby form a protective capsule 141 or 142. In general, the elongated passageway 178 has a relatively small cross-sectional area such that the flow of molten polymer material from second cavity portion 159 to the first cavity portion 158 is substantially restricted. The polymer material in elongated passageway 178 forms the polymer bridges 149 (FIGS. 24-26) that interconnect the capsules 141 with the polymer material 146. Although the precise size and configuration of the elongated passageway 178 may vary depending upon the needs of a particular application, in the illustrated example, the passageway 178 has a width and a height of about 0.060 inches, and has a cross-sectional shape that is approximately semi-circular. The area of a half circle is equal to $\pi r^2/2$, such that the cross-sectional area of elongated passageway 178 is approximately 0.0056 square inches. It will be understood that the length and cross-sectional area of elongated passageway 178 may vary depending upon the electrical component being encapsulated by protective capsules 141 and 142, the type of polymer material used, and other such factors.

The passageway 178 restricts the flow of the molten polymer material over the LEDs 131 and other circuit components 132, 133. Because the first cavity portion 158 is substantially sealed by ridge 173 and contact surface 174, molten polymer material flowing into first cavity portion 158 from elongated passageway 178 cannot flow freely over LED 131 or circuit components 132, 133. In this way, the amount of heat and pressure transferred into the LEDs 131 and/or components 132, 133 by the molten polymer material is limited. Furthermore, because the flow of polymer material in first cavity portion 158 is substantially restricted, the forces imposed on LED 131 and circuit components 132 and 133 due to flow of the molten polymer material is substantially reduced or controlled. In this way, the use of first cavity portion 158 with a small elongated feeder passageway 178 prevents damage to LEDs 131 and circuit components 132, 133 and/or dislodgement of these components that could otherwise occur if a single large mold cavity were utilized. Furthermore, because the protective capsules 141 and 142 are largely disconnected from the other polymer material forming layer 146 covering circuit 101 when intermediate part 136 is formed, the LEDs 131 and components 132 and 133 do not experience forces that might otherwise be generated as the polymer material cools and hardens.

With reference back to FIG. 21, LEDs 131 and electrical components 132, 133 are connected to a first conductor 134 and a second conductor 135 of web 131 to provide positive and negative power to the components. In general, gaps 138 are formed between the first and second conductors 134, 135, and the LEDs 131 and electrical components 132, 133 span the gaps 138. With reference back to FIG. 28, the contact surface 174 of ridge 173 of first mold part 156 contacts the upper surface 119 of circuit 101. However, the contact surface 174 also spans the gaps 138 directly adjacent the LED 131 or other circuit components 132 and 133. Thus, the gaps 138 fill with molten polymer material that flows into the gaps 138 from second cavity portion 159, and/or first cavity portion 158. Alternately, some polymer material may flow from second cavity portion 159 through gap 138 into first cavity portion 158. Thus, although the elongated passageway 178 generally provides the primary source of polymer flow from second cavity portion 159 into first cavity portion 158, some polymer material may flow through gaps 138 as well. The gaps 138 may be quite small in the vicinity of the LEDs 131 and/or other circuit components 132 and 133 to restrict the flow of polymer through gaps 138. In the illustrated example, the gaps 138 have a width of about 0.015-0.030 inches. Thus, if the circuit 101 is 0.020 inches thick, and gap 138 is also 0.020 inches, the cross-sectional area of gap 138 is 0.0004 square inches, much smaller than the cross-sectional area of a typical passageway 178 noted above.

Referring again to FIG. 29, an elongated passageway 179 in second mold part 157 extends from first cavity portion 160 of second mold part 157 to second cavity portion 171 to provide for flow of molten polymer material from second cavity portion 171 to first cavity 160. The elongated passageway 179 in second mold part 157 forms the bridges 165 and 168 of polymer material interconnecting the polymer layer 170 with the polymer material 161 on surface 118 of conductor 101. The passageway 179 may have substantially the same size and shape as passageway 178, and it similarly restricts the flow of molten polymer material between the first cavity portion 160 of second mold part 157 and the second cavity portion 171 of second mold part 157.

Figure 30:
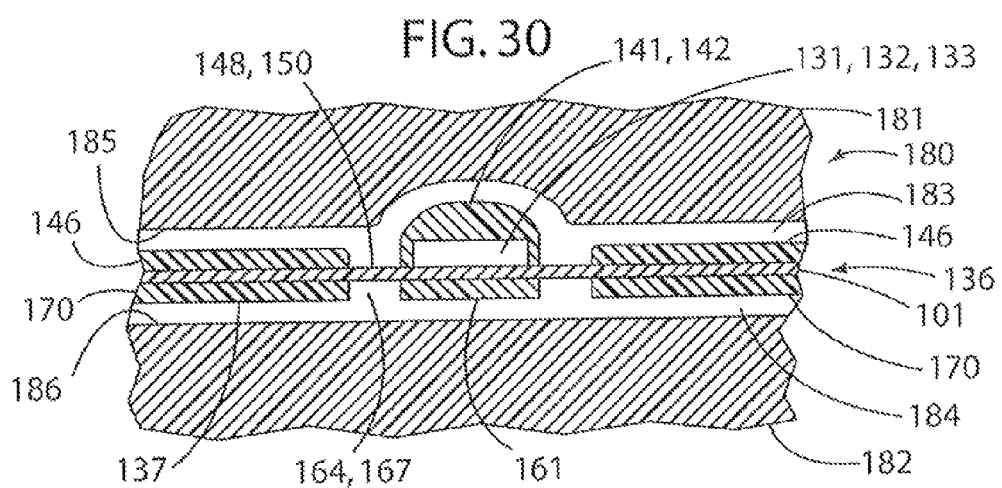
FIG. 30 is a cross-sectional view of the component of FIG. 27 positioned in a second mold tool immediately prior to injection of additional polymer material around the device.

After the intermediate part 136 with protective capsules 141 and 142 is formed in first mold tool 155, the intermediate part 136 is positioned in a second mold tool 180 (FIG. 30). The second mold tool 180 may include a plurality of pins or the like (not shown) that engage locating openings (also not shown) in intermediate part 136, to thereby position the intermediate part 136 in second mold tool 180. Second mold tool 180 includes a first mold part 181 and a second mold part 182. First mold part 181 includes a first cavity portion 183 formed between the intermediate part 136 and inner surface 185. Similarly, second mold part 182 forms a cavity portion 184 between inner surface 186 of second mold part 182 and intermediate part 136. Molten polymer material is injected into the cavity portions 183 and 184 to thereby overmold the protective capsules 141 and 142 and form the finished part 100 (FIG. 15). Because the LEDs and/or other electrical components are protected by protective capsules 141 and 142, the polymer material flowing into cavity portion 183 does not directly contact the LEDs and/or other electrical components. The protective capsules thereby ensure that the LEDs and/or other electrical components are not damaged due to excessive heat from the molten polymer material. The protective capsules also ensure that the LEDs and/or other electrical components are not dislodged due to forces generated by the molten polymer material. The small polymer layer 161 on lower side 137 of intermediate part 136 is physically connected to the capsules 141 and 142 by polymer material that has flowed into gaps 138 (see also FIG. 21) immediately adjacent the LEDs and other components. The small layer 161 thereby mechanically secures the capsules 141 and 142 to the circuit 101 to prevent dislodgement of the protective capsules 141 and 142 during the second shot molding step utilizing second mold tool 180 of FIG. 30. The capsules 141, 142 and layer 161 also serve to strengthen intermediate part 136 to prevent damage due to bending or the like to thereby facilitate handling of part 136.

Although the device 100 has been described as being formed by a two-shot molding process, it will be understood that device 100 or other such components may be made utilizing a single-shot molding process according to other aspects of the present invention. If a single-shot molding process is utilized, a web 130 (FIG. 20) is first formed, and the LEDs and other components are then secured to the web 130 (FIG. 21). The web 130 with the electrical components secured thereto is then positioned in a mold tool having a mold cavity defining a shape that is substantially similar to the desired surface contour of the finished part.

Furthermore, according to other aspects of the present invention, more than two molding shots may be utilized if required for a particular application. If three or more molding shots are utilized, third or fourth mold tools (not shown) having additional cavity spaces are utilized. In the illustrated example, the polymer material utilized to form part 100 comprises a light-transmitting colored polymer that is red, amber, or the like to provide a turn signal, brake light, or the like for a motor vehicle. In general, the LEDs may be chosen to have a color corresponding to the color of the polymer material to provide the desired color. If desired for a particular application, opaque polymer material may be injected over portions of the conductor 101 during a first molding shot, or opaque polymer material may be overmolded in a second, third, or subsequent mold shot. In this way, the part 100 may include both opaque polymer material and clear or other colored light-transmitting polymer material as required for a particular application.

Figure 31:
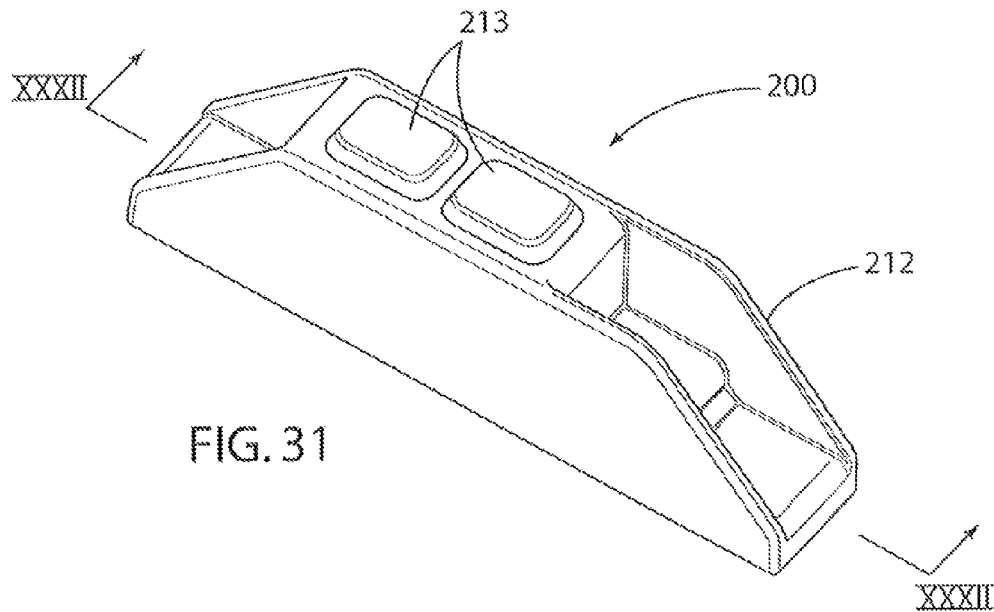
FIG. 31 is an isometric view of a device according to another aspect of the present invention.
Figure 32:
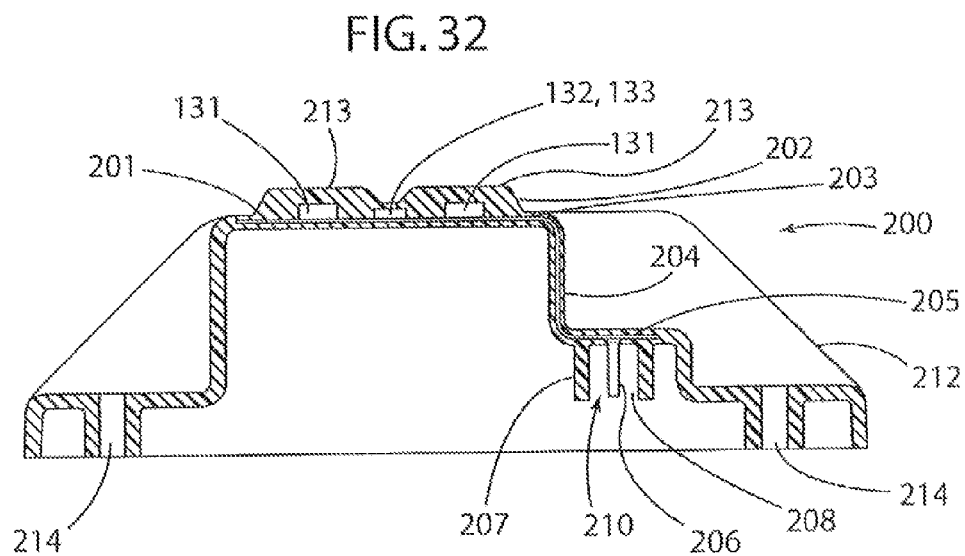
FIG. 32 is a cross-sectional view of the device of FIG. 31 taken along the line XXXII-XXXII.

With further reference to FIGS. 31 and 32, a device 200 according to another aspect of the present invention comprises a light having one or more LEDs 131 and electrical components 132 and 133 that are secured to a circuit 201. The circuit 201 and LEDs 131, and other components 132, 133 are embedded in a polymer material body 202 that may be formed in substantially the same manner as described in detail above in connection with the LED light assembly 100. The circuit 201 includes a generally flat primary portion 203, and an intermediate portion 204 that extends transversely away from flat primary portion 203. An end portion 205 of circuit 201 extends transversely from intermediate portion 204, and includes two or more cantilevered prongs 206. The prongs 206 are positioned within a receptacle 210 formed by a generally cylindrical sidewall 207 having an open end 208. The receptacle 210 provides a conventional electrical connector to connect the device 200 to a 12 volt D.C. power source of a motor vehicle. Unlike a conventional flat circuit board, the metal circuit 201 may be deformed into a non-planar three-dimensional shape as shown in FIG. 32, and it may be substantially encapsulated in polymer material forming a housing 212 of device 200. Device 200 includes lens portions 213 over the LEDs 131 to provide the desired light distribution. In the illustrated example, the LEDs 131 of device 200 are white LEDs, and the polymer material utilized to form the housing 212 is a substantially transparent polymer material. Device 200 includes openings 214 that receive conventional threaded fasteners or the like to secure the device 200 to a vehicle, vehicle trailer, or the like. Device 200 may illuminate a license plate, or other vehicle exterior component.

Although the devices 100 and 200 are described as being LED light assemblies, it will be understood that the device, methods, and tools of the present invention are not limited to light assemblies. Specifically, various electrical circuit components other than LEDs may be secured to a web, and the components may be overmolded utilizing a one-, two-, or more shot process as described in detail above. The polymer material utilized to overmold the electrical components may be opaque, and may be configured to provide a decorative finished surface. In this way, separate housing and circuit board structures are eliminated. Components fabricated in this way may have a virtually unlimited range of shapes and configurations as required for a particular application. Furthermore, because the electrical components and the circuit material are overmolded and completely sealed within the polymer (with the possible exception of the exposed metal utilized to electrically connect the device to an external power source), a device fabricated according to the present invention is substantially waterproof, and very durable. Because the metal utilized to form the circuit can be bent into a wide variety of shapes, a device according to the present invention is not limited to a substantially flat configuration as with conventional circuit boards. A device according to the present invention may be configured to fit within a relatively confined three-dimensional space dictated by other design considerations such as aesthetics, packaging for other components, and the like.

An electrical device according to the present invention may comprise any one of a wide variety of devices including, for example, light assemblies for vehicle interiors, dashboard components, or other electrical devices that are not part of a vehicle, such as a camera, printer, computer, audio equipment, television, DVD player, microwave oven or other kitchen device or utensil utilizing electrical components, thermostats for controlling HVAC systems of buildings, and/or communications equipment. The electrical device according to the present invention may also comprise an electrical device or light suitable for marine use, or it may comprise a children's toy or the like. Similarly, the electrical device may comprise an illuminated sign for use in a building or the like, or an exterior sign that may be illuminated, and may be attached to a building, or may be free-standing or attached to another structure. Still further, the electrical device may comprise a free-standing light suitable for use on a desk, table, or the like, or the device may comprise a hand-held light, or a light that is attachable to another device or the like. Still further, the electrical device may comprise a light for a semi-trailer, boat trailer, or other such application. Still further, the electrical device may comprise a light forming a turn signal, a stoplight for a vehicle, or the like. It will be appreciated that virtually any electrical component may be overmolded into a polymer structure, and the illustrated examples of LEDs, resistors, and diodes are merely examples of components that may be utilized to form an electrical device according to the present invention.

Also, it will be appreciated that the electrical device 1 may be formed to have a wide variety of shapes, and the device 1 need not be limited to a generally planar configuration as shown in the illustrated example. For example, the conductors forming the circuit may be formed into a wide variety of non-planar configurations, such that the electrical components are not all positioned in the same plane. In this way, the electrical device 1 may be configured to fit within a limited space and thereby reduce the space required for the finished assembly. This, in turn, may substantially reduce the amount of wasted space that would otherwise occur if a planar circuit board were utilized.

In the foregoing description, it will be readily appreciated by those skilled in the art that modifications may be made to the invention without departing from the concepts disclosed herein. Such modifications are to be considered as included in the following claims, unless these claims by their language expressly state otherwise.

The invention claimed is:

1. A method of forming an electrical device, the method comprising:

cutting a sheet of conductive material to form a circuit having at least two electrically conductive circuit elements, each having first and second opposite sides;

securing at least one electrical component to the first sides of the circuit elements;

positioning the circuit and electrical component in a first mold cavity having a first shape;

molding thermoplastic polymer material around the electrical component while it is in the first mold cavity to encapsulate the electrical component in a protective enclosure of polymer material and define an intermediate light assembly, the protective enclosure having a first portion in contact with the first sides of the conductive circuit elements around the electrical component, the protective enclosure having peripheral edge portions extending around at least a portion of the electrical component;

positioning the circuit element and electrical component in a second mold cavity having a second shape that is substantially different than the first shape;

molding thermoplastic polymer material over at least a portion of the protective enclosure while at least a substantial portion of the intermediate light assembly is disposed in the second mold cavity.

2. The method of claim 1, wherein:

the first sides of the conductive circuit elements define generally flat first surface portions;

the peripheral edge portions extend to the flat first surface portion and define a peripheral edge surface that is transverse to the flat surface portion.

3. The method of claim 2, wherein:

an exposed portion of the first surface portion is not covered by the protective enclosure of polymer prior to positioning the circuit and electrical component in the second mold cavity; and including:

molding thermoplastic polymer material over the exposed portion.

4. The method of claim 3, wherein:

the first mold cavity is shaped to mold additional thermoplastic polymer material over at least a substantial portion of the first sides of the conductive circuit elements, wherein the additional thermoplastic material includes an edge portion that is spaced apart from the protective enclosure to define a groove extending around the electrical component.

5. The method of claim 4, wherein:

the groove formed by the first mold cavity is generally C-shaped in plan view, and wherein a bridge of polymer material extends from the additional polymer material to the protective enclosure.

6. The method of claim 4, wherein:

the groove defines a base surface, and at least a portion of the base surface comprises exposed conductive material.

7. The method of claim 1, wherein:

the step of securing at least one electrical circuit component includes soldering the circuit component to the circuit element.

8. The method of claim 1, wherein:

the step of securing at least one electrical circuit component includes deforming the conductive circuit element to crimp the circuit component to the conductive circuit element.

9. The method of claim 1, wherein:

the electrical component comprises an LED, and the electrical device comprises a light.

10. The method of claim 9, including:
molding a light-control feature over the LED utilizing the thermoplastic material.

11. The method of claim 9, wherein:
at least one additional electrical component in addition to the LED is secured to the circuit element; and
a protective enclosure of thermoplastic polymer material is molded over the additional electrical component.

12. The method of claim 9, wherein:
the enclosure is generally dome-shaped.

13. The method of claim 1, wherein:
the electrical component comprises an integrated circuit having a generally quadrilateral perimeter;
the peripheral edge of the enclosure of polymer material has a generally quadrilateral shape.

14. The method of claim 1, including:
forming a first generally flat portion of the conductive circuit element;
forming a second portion of the conductive circuit element that extends transversely from the first portion; and
molding polymer material over at least a substantial portion of the first and second portions of the conductive circuit element.

15. The method of claim 14, wherein:
the electrical device comprises a light, and the electrical component comprises an LED that is secured to the first portion of the conductive circuit element.

16. The method of claim 14, including:
forming a third portion of the conductive circuit element that extends transversely from the second portion;
forming at least two prongs that extend from the third portion; and
molding a receptacle in the form of a tubular wall forming a cavity having an open outer end, wherein the prongs are disposed in the cavity.

17. The method of claim 1, wherein:
the conductive circuit element defines an outer edge; and including:
molding thermoplastic material to form a mounting flange that extends outwardly from the outer edge.

18. The method of claim 1, wherein:
the electrical device includes first and second opposite sides, and a periphery extending around the electrical device; and including:
molding thermoplastic polymer material to form at least a portion of the periphery, wherein a substantial portion of the periphery is non-linear.

19. The method of claim 18, wherein:
a substantial portion of the periphery is curved.

20. The method of claim 19, wherein:
the electrical device comprises a disk-shaped light having a circular periphery.

21. The method of claim 20, wherein:
a plurality of the electrical components comprise LEDs; and wherein:
the first side of the electrical device includes a generally planar surface portion, and a plurality of discrete convex raised portions, aligned with the LEDs, and wherein the raised portions protrude outwardly from the planar surface portion.

22. A method of forming an electrical device, the method comprising:
forming a circuit having at least two electrically conductive circuit elements that are spaced apart to define gaps between the two electrically conductive circuit elements, and wherein the two electrically conductive circuit elements are initially interconnected by connecting portions that extend across the gaps and physically interconnect the two electrically conductive circuit elements, each electrically conductive circuit element having first and second opposite sides;
securing at least one electrical component to the first sides of the circuit elements;
forming an intermediate assembly by molding protective thermoplastic polymer material around the one electrical component to at least partially cover the one electrical component with the polymer material;
allowing the protective thermoplastic polymer material to solidify;
cutting the connecting portions such that the electrically conductive circuit elements are disconnected from one another;
molding additional thermoplastic polymer material over at least a portion of the protective thermoplastic polymer material; and
allowing the additional thermoplastic polymer material to solidify.

23. The method of claim 22, including:
providing a mold defining a first mold cavity;
positioning at least a portion of the two electrically conductive circuit elements and the one electrical component in the first mold cavity; and
molding protective thermoplastic polymer material in the first mold cavity.

24. The method of claim 23, including:
forming at least one opening through at least one of the two electrically conductive circuit elements;
providing the mold with a locating member;
positioning the portion of the two electrically conductive circuit elements and the one electrical component in the first mold cavity with the locating member in engagement with the one opening.

25. The method of claim 22, wherein:
the two electrically conductive circuit elements are formed from sheet metal.

26. The method of claim 22, wherein:
molding protective thermoplastic polymer material includes encapsulating the one electrical component with thermoplastic polymer material.

27. The method of claim 22, wherein:
the first sides of the first and second electrically conductive circuit elements have generally flat first side portions that are spaced apart to form a gap;
the one electrical component is secured to the generally flat first side portions with the one electrical component extending across the gap; and
the protective thermoplastic polymer material is formed into a protective enclosure extending at least partially over and around the one electrical component and in contact with the first sides of the first and second electrically conductive members.

28. The method of claim 27, wherein:
the protective enclosure is formed to include a peripheral surface portion extending around the one electrical component and transversely away from the generally flat first side portions of the first and second electrically conductive circuit elements.

29. The method of claim 28, wherein:
the peripheral surface portion intersects the flat first side portions to define a curved edge when viewed along an axis that is normal to the flat first side portions.

30. The method of claim 29, wherein:
the protective thermoplastic polymer material is formed to include first thermoplastic polymer material extending over at least a portion of the first sides of the first and second electrically conductive circuit elements adjacent the protective enclosure, wherein the first thermoplastic polymer material is spaced apart from the protective enclosure to form a gap, and including thermoplastic polymer material interconnecting the first thermoplastic polymer material and the protective thermoplastic polymer material.

31. The method of claim 30, including:
providing a mold cavity having a first portion that is utilized to form the first thermoplastic polymer material, and a second portion that is utilized to form the protective enclosure of thermoplastic polymer material, and a connecting portion forming a passageway extending between and fluidly interconnecting the first and second portions of the mold cavity; and:
introducing molten thermoplastic material into the first portion of the mold cavity, and causing the molten thermoplastic polymer material to flow from the first portion of the mold cavity through the passageway and into the second portion of the mold cavity.

32. The method of claim 31, wherein:
the passageway restricts flow of molten thermoplastic polymer material from the first mold cavity portion to the second mold cavity portion, and prevents dislodgement of the one electrical component from the first and second electrically conductive circuit elements.

33. The method of claim 32, wherein:
the passageway has a cross-sectional area of approximately 0.0056 square inches.

34. The method of claim 31, wherein:
the passageway has a cross-sectional shape that is approximately semi-circular.

35. The method of claim 31, wherein:
the passageway defines a first volume; and
the second portion of the mold cavity defines a second volume that is much greater than the first volume.

36. The method of claim 31, wherein:
the mold cavity comprises a first mold cavity; and including:
providing a second mold cavity;
removing the intermediate assembly from the first mold cavity;
positioning the intermediate assembly in the second mold cavity; and
introducing molten thermoplastic polymer material into the second mold cavity to thereby mold the additional thermoplastic polymer material over at least a portion of the protective thermoplastic polymer material.

37. The method of claim 22, including:
providing first and second electrical connectors that are electrically connected to the two electrically conductive circuit elements; and
forming the thermoplastic polymer material such that the first and second electrical connectors protrude outside the additional thermoplastic material after it solidifies.

38. The method of claim 37, wherein:
the first and second electrical connectors comprise prongs.

39. The method of claim 38, wherein:
the first and second electrically conductive members are made from sheet metal; and
the prongs are formed integrally from the sheet metal.

40. A method of forming an electrical device, the method including:
mechanically cutting sheet metal to form first and second conductive circuit elements having first and second sides and defining gaps between the first and second circuit elements;
securing a plurality of electrical components to the first and second conductive circuit elements;
providing a mold cavity having a first cavity portion and a second cavity portion, and a passageway defining a shape and interconnecting the first and second cavity portions;
molding first thermoplastic polymer material onto at least a portion of the first sides of the first and second conductive circuit elements by introducing molten thermoplastic polymer material into the first cavity portion;
causing molten thermoplastic polymer material to flow through the passageway from the first cavity portion to the second cavity portion to thereby mold protective thermoplastic polymer material over at least a portion of the first sides of the first and second conductive circuit elements;
permitting the thermoplastic polymer material in the mold cavity to solidify; and wherein:
the thermoplastic polymer material forms enclosures that extend at least partially over and around the electrical components and contact the first sides of the first and second conductive circuit elements, and wherein the enclosures are connected to the first thermoplastic polymer material by thermoplastic polymer material forming a connector having a shape corresponding to the shape of the passageway.

41. The method of claim 40, wherein:
the enclosure is generally dome-shaped.

42. The method of claim 41, wherein:
the enclosure has a circular perimeter.

43. The method of claim 40, wherein:
the first thermoplastic polymer material and the thermoplastic polymer material forming the enclosure are spaced apart to define a gap therebetween.

44. The method of claim 43, wherein:
the gap extends around the enclosure and is generally C-shaped.

45. The method of claim 40, wherein:
the enclosure has a generally quadrilateral perimeter.

46. The method of claim 40, wherein:
the mold cavity comprises a first mold cavity; including:
providing a second mold cavity;
removing the first and second conductive circuit elements from the first mold cavity;
positioning at least a portion of the first and second conductive circuit elements in the second mold cavity; and
molding additional thermoplastic polymer material over at least one of the enclosures by introducing molten thermoplastic polymer material into the second mold cavity.

* * * * *